United States Patent
Ahn et al.

(10) Patent No.: US 8,634,040 B2
(45) Date of Patent: Jan. 21, 2014

(54) MULTI DISPLAY DEVICE

(75) Inventors: Youngjoon Ahn, Gumi (KR); Wonjae Jeon, Gumi (KR); Kyungtae Kim, Gumi (KR)

(73) Assignee: LG Electronics Inc., Seoul (KR)

( * ) Notice: Subject to any disclaimer, the term of this patent is extended or adjusted under 35 U.S.C. 154(b) by 218 days.

(21) Appl. No.: 13/085,981

(22) Filed: Apr. 13, 2011

(65) Prior Publication Data
US 2011/0260949 A1 Oct. 27, 2011

(30) Foreign Application Priority Data

Apr. 26, 2010 (KR) ........................ 10-2010-0038458
May 24, 2010 (KR) ........................ 10-2010-0048079

(51) Int. Cl.
*G02F 1/133* (2006.01)
(52) U.S. Cl.
USPC .............................................. 349/59; 349/73
(58) Field of Classification Search
None
See application file for complete search history.

(56) References Cited

U.S. PATENT DOCUMENTS

| | | | |
|---|---|---|---|
| 6,337,727 B1* | 1/2002 | Ono et al. | 349/153 |
| 2003/0223249 A1* | 12/2003 | Lee et al. | 362/561 |
| 2004/0012729 A1* | 1/2004 | Kim | 349/58 |
| 2009/0066606 A1* | 3/2009 | Park et al. | 345/1.3 |
| 2009/0315440 A1* | 12/2009 | Makino et al. | 313/1 |

* cited by examiner

*Primary Examiner* — Mike Stahl
(74) *Attorney, Agent, or Firm* — KED & Associates LLP

(57) ABSTRACT

A multi display device is disclosed. The multi display device includes a first display panel, a first frame positioned on a back surface of the first display panel, a first electromagnetic shielding layer including a first portion positioned on a front surface of the first display panel and a second portion positioned on the side of the first display panel, a second display panel positioned adjacent to the first display panel, a second frame positioned on a back surface of the second display panel, and a second electromagnetic shielding layer including a first portion positioned on a front surface of the second display panel and a second portion positioned on a side surface of the second display panel.

14 Claims, 30 Drawing Sheets

FIG. 7
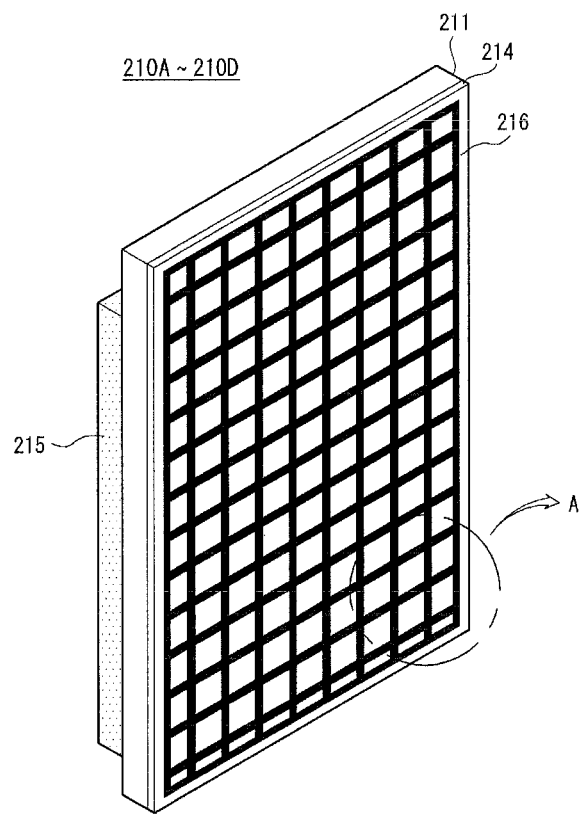
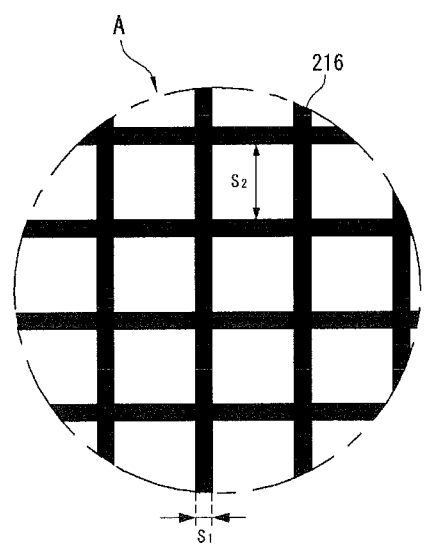

FIG. 12
(a)
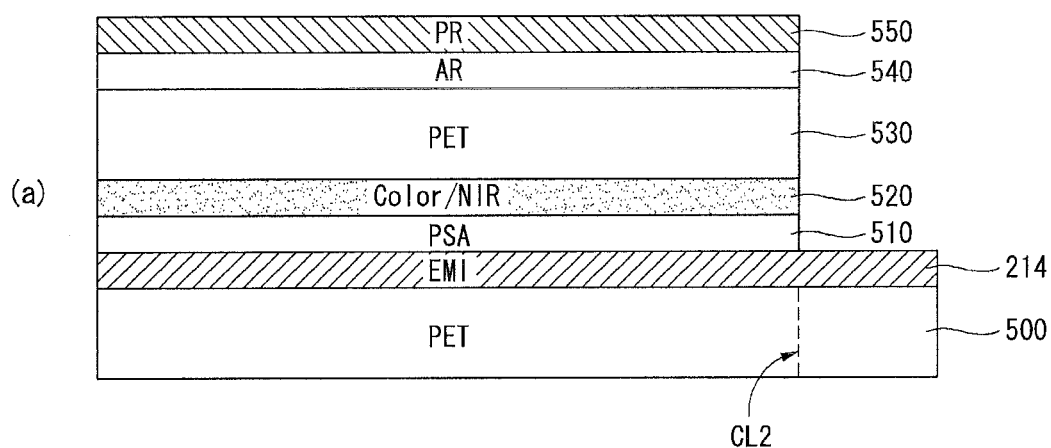
(b)
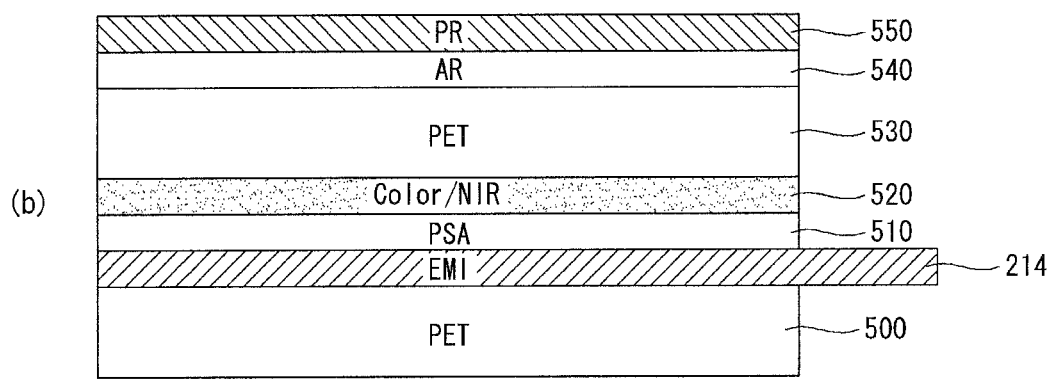

FIG. 26
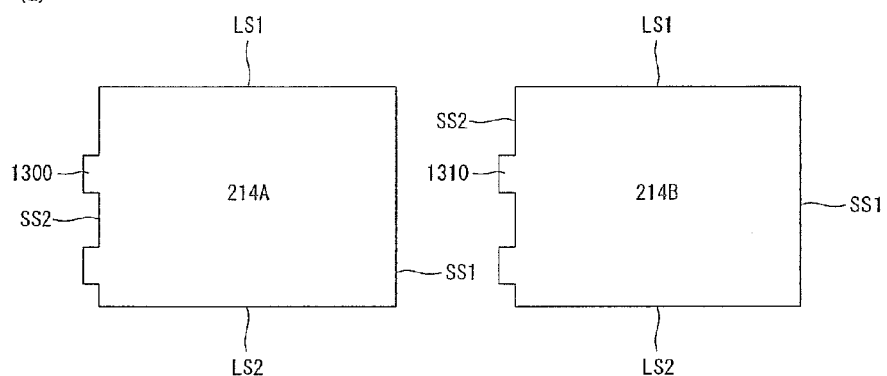
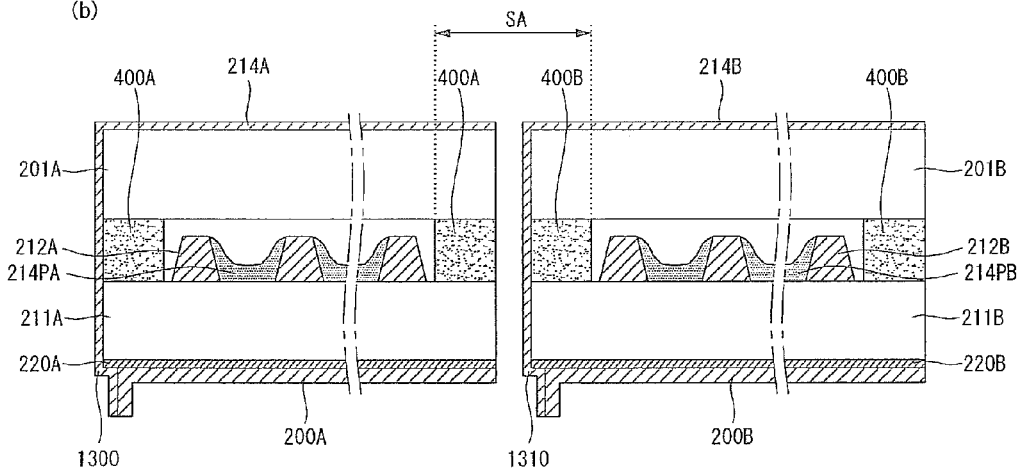

MULTI DISPLAY DEVICE

This application claims the benefit of Korean Patent Application Nos. 10-2010-0038458 filed on Apr. 26, 2010 and 10-2010-0048079 filed on May 24, 2010, which are incorporated herein by reference for all purposes as if fully set forth herein.

BACKGROUND OF THE INVENTION

1. Field of the Invention

Embodiments of the invention relate to a multi display device.

2. Description of the Related Art

A multi display device includes a plurality of display panels that are positioned adjacent to one another. The display panels display an image on the screen. Examples of the display panel include a liquid crystal display (LCD), a field emission display (FED), an organic light emitting diode (OLED) display, and a plasma display panel (PDP).

SUMMARY OF THE INVENTION

In one aspect, there is a multi display device comprising a first display panel, a first frame positioned on a back surface of the first display panel, a first electromagnetic shielding layer including a first portion positioned on a front surface of the first display panel and a second portion positioned on the side of the first display panel, a second display panel positioned adjacent to the first display panel, a second frame positioned on a back surface of the second display panel, and a second electromagnetic shielding layer including a first portion positioned on a front surface of the second display panel and a second portion positioned on a side surface of the second display panel.

In another aspect, there is a multi display device comprising a first display panel, a first frame positioned on a back surface of the first display panel, a first electromagnetic shielding layer that is positioned on a front surface of the first display panel and extends to the first frame, a second display panel positioned adjacent to the first display panel in a first direction, a second frame positioned on a back surface of the second display panel, and a second electromagnetic shielding layer that is positioned on a front surface of the second display panel and extends to the second frame, wherein a portion of the first electromagnetic shielding layer extending to the first frame and a portion of the second electromagnetic shielding layer extending to the second frame are positioned between the first and second display panels.

In another aspect, there is a multi display device comprising a first display panel, a first frame positioned on a back surface of the first display panel, a first electromagnetic shielding layer positioned on a front surface of the first display panel, a first conductive part positioned on the side of the first display panel, the first conductive part having one end connected to the first electromagnetic shielding layer and the other end connected to the first frame, a second display panel positioned adjacent to the first display panel in a first direction, a second frame positioned on a back surface of the second display panel, a second electromagnetic shielding layer positioned on a front surface of the second display panel, and a second conductive part positioned on the side of the second display panel, the second conductive part having one end connected to the second electromagnetic shielding layer and the other end connected to the second frame, wherein the first conductive part and the second conductive part are positioned between the first display panel and the second display panel.

In another aspect, there is a multi display device comprising a first display panel, a first frame positioned on a back surface of the first display panel, a first electromagnetic shielding layer positioned on a front surface of the first display panel, a second display panel positioned adjacent to the first display panel, a second frame positioned on a back surface of the second display panel, and a second electromagnetic shielding layer positioned on a front surface of the second display panel, wherein the first electromagnetic shielding layer and the first frame are connected to each other on one side of the first display panel, and the second electromagnetic shielding layer and the second frame are connected to each other on one side of the second display panel, wherein the other side of the first display panel opposite the one side of the first display panel is adjacent to the one side of the second display panel.

In another aspect, there is a multi display device comprising a first display panel, a second display panel positioned adjacent to the first display panel in a first direction, a third display panel positioned adjacent to the first display panel in a second direction crossing the first direction, a fourth display panel that is positioned adjacent to the third display panel in the first direction and is positioned adjacent to the second display panel in the second direction, a first frame positioned on a back surface of the first display panel, a first electromagnetic shielding layer positioned on a front surface of the first display panel, a second frame positioned on a back surface of the second display panel, a second electromagnetic shielding layer positioned on a front surface of the second display panel, a third frame positioned on a back surface of the third display panel, a third electromagnetic shielding layer positioned on a front surface of the third display panel, a fourth frame positioned on a back surface of the fourth display panel, and a fourth electromagnetic shielding layer positioned on a front surface of the fourth display panel, wherein the first electromagnetic shielding layer is connected to the first frame in a first region of the first display panel, wherein the second electromagnetic shielding layer is connected to the second frame in a first region of the second display panel, wherein the third electromagnetic shielding layer is connected to the third frame in a first region of the third display panel, wherein the fourth electromagnetic shielding layer is connected to the fourth frame in a first region of the fourth display panel, wherein a second region of the first display panel opposite the first region of the first display panel is adjacent to the first region of the second display panel in the first direction, wherein a second region of the third display panel opposite the first region of the third display panel is adjacent to the first region of the fourth display panel in the first direction.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIGS. 1 to 7 illustrate a configuration of a multi display device according to an exemplary embodiment of the invention;

FIGS. 8 to 22 illustrate a structure of a multi display device according to an exemplary embodiment of the invention;

FIGS. 23 to 27 illustrate another structure of a multi display device according to an exemplary embodiment of the invention.

DETAILED DESCRIPTION OF THE EMBODIMENTS

Reference will now be made in detail embodiments of the invention examples of which are illustrated in the accompanying drawings.

According to various embodiments of the invention, any one or more features from one embodiment/example/variation of the invention can be applied to (e.g., added, substituted, modified, etc.) any one or more other embodiments/examples/variations discussed below according to the invention. Further any operations/methods discussed below can be implemented in any of these devices/units or other suitable devices/units.

FIGS. 1 to 7 illustrate a configuration of a multi display device according to an exemplary embodiment of the invention.

Figure 1:
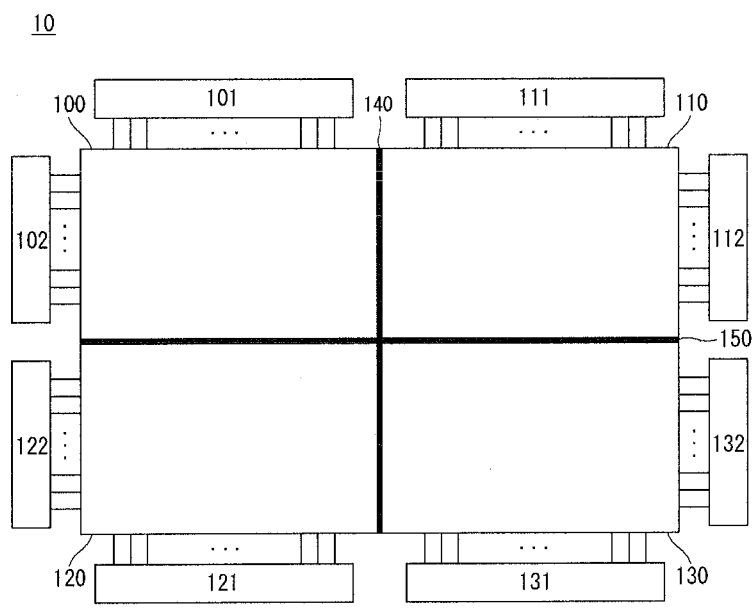

As shown in FIG. 1, a multi display device 10 according to an exemplary embodiment of the invention may include a plurality of plasma display panels 100, 110, 120, and 130 that are positioned adjacent to one another.

The exemplary embodiment of the invention uses a plasma display panel as an example of a display panel. Other kinds of display panels may be used. For example, a liquid crystal display (LCD), a field emission display (FED), and an organic light emitting diode (OLED) display may be used. Namely, the exemplary embodiment of the invention may use any kind of display panel as long as an electromagnetic shielding layer is positioned on a front surface of the display panel.

A 1-1 driver 101 and a 1-2 driver 102 may supply driving signals to the first plasma display panel 100 of the plurality of plasma display panels 100, 110, 120, and 130. The 1-1 driver 101 and the 1-2 driver 102 may be integrated into one driver. Further, a 2-1 driver 111 and a 2-2 driver 112 may supply driving signals to the second plasma display panel 110. In other words, the multi plasma display panel 10 may be configured so that the plasma display panels 100, 110, 120, and 130 included in the multi plasma display panel 10 receive the driving signals from different drivers, respectively.

The driver related to each of the plasma display panels 100, 110, 120, and 130 may be a driving board.

Figure 2:
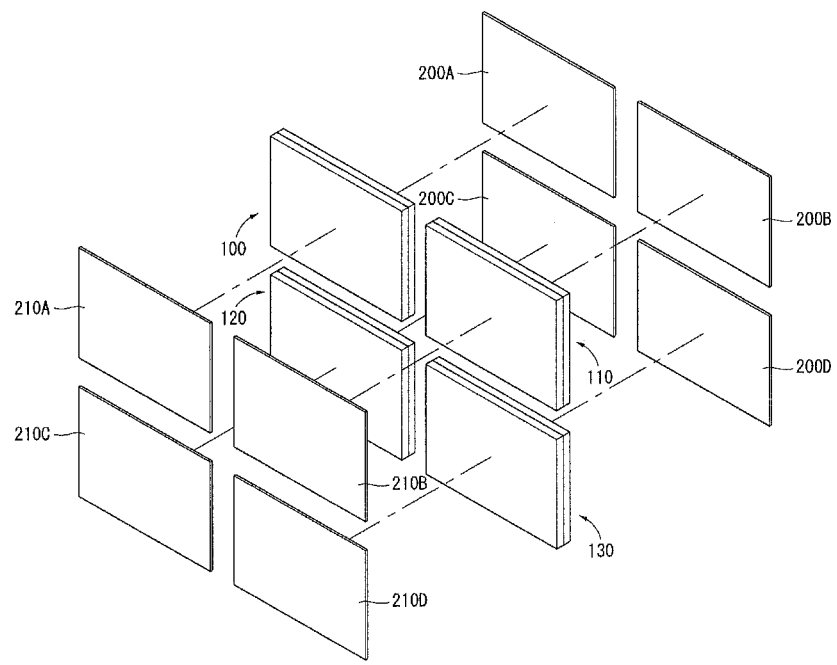

As shown in FIG. 2, a first frame 200A may be positioned on a back surface of the first plasma display panel 100 (i.e., a back surface of a back substrate of the first plasma display panel 100). A second frame 200B may be positioned on a back surface of the second plasma display panel 110, a third frame 200C may be positioned on a back surface of the third plasma display panel 120, and a fourth frame 200D may be positioned on a back surface of the fourth plasma display panel 130.

The first to fourth frames 200A-200D may be formed of a metal material. The first to fourth frames 200A-200D may indicate a metal plate, a heat dissipation plate, a heat dissipation frame, a chassis, etc.

Further, a first filter 210A may be positioned on a front surface of the first plasma display panel 100 (i.e., a front surface of a front substrate of the first plasma display panel 100). A second filter 210B may be positioned on a front surface of the second plasma display panel 110, a third filter 210C may be positioned on a front surface of the third plasma display panel 120, and a fourth filter 210D may be positioned on a front surface of the fourth plasma display panel 130. Further, each of the first to fourth filters 210A-210D may include an electromagnetic shielding layer (not shown).

Further, first to fourth driving boards for supplying the driving signals to the first to fourth plasma display panels 100, 110, 120, and 130 may be respectively positioned on back surfaces of the first to fourth frames 200A-200D. As shown in FIG. 1, the first driving board may correspond to the drivers 101 and 102, the second driving board may correspond to the drivers 111 and 112, the third driving board may correspond to the drivers 121 and 122, and the fourth driving board may correspond to the drivers 131 and 132.

Further, a seam area SA (refer to FIG. 13) may be formed between the two adjacent plasma display panels. The seam area SA may indicate an area between the two adjacent plasma display panels.

Because the multi plasma display panel 10 displays an image on the separate plasma display panels 100, 110, 120, and 130 positioned adjacent to one another, the seam area SA may be formed between the two adjacent plasma display panels.

The plasma display panels 100, 110, 120, and 130 may display an image in a frame including a plurality of subfields.

Figure 3:
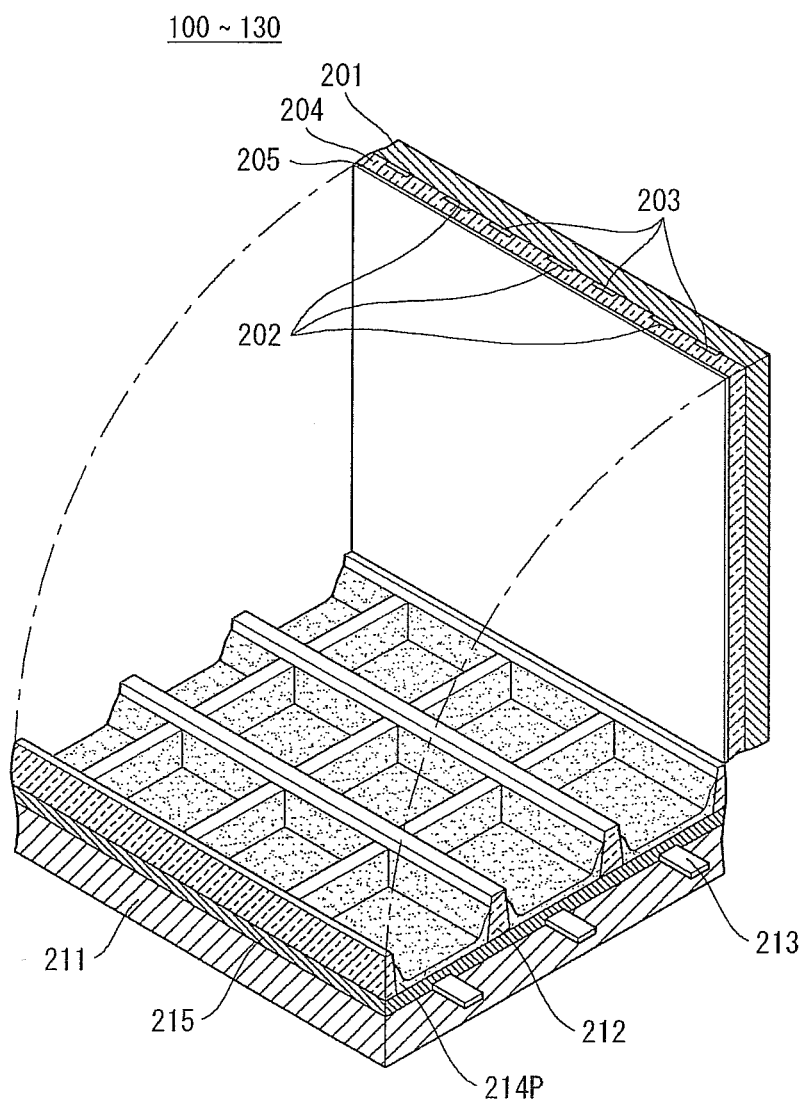

More specifically, as shown in FIG. 3, each of the plurality of plasma display panels 100, 110, 120, and 130 may include a front substrate 201, on which a plurality of first electrodes 202 and 203 are formed, and a back substrate 211 on which a plurality of second electrodes 213 are formed to cross the first electrodes 202 and 203.

Figure 4:
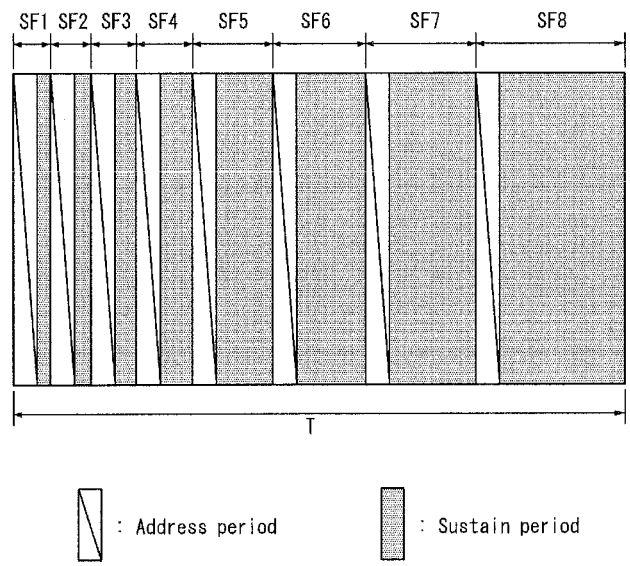
Figure 5:
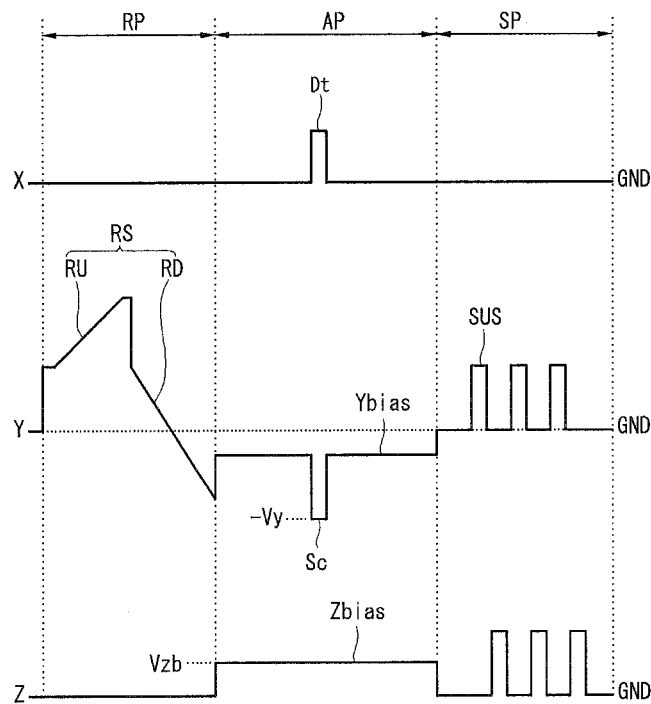

In FIGS. 3 to 5, the first electrodes 202 and 203 may include scan electrodes 202 and sustain electrodes 203 substantially parallel to each other, and the second electrodes 213 may be referred to as address electrodes.

An upper dielectric layer 204 may be formed on the scan electrode 202 and the sustain electrode 203 to limit a discharge current of the scan electrode 202 and the sustain electrode 203 and to provide insulation between the scan electrode 202 and the sustain electrode 203.

A protective layer 205 may be formed on the upper dielectric layer 204 to facilitate discharge conditions. The protective layer 205 may be formed of a material having a high secondary electron emission coefficient, for example, magnesium oxide (MgO).

A lower dielectric layer 215 may be formed on the address electrode 213 to provide insulation between the address electrodes 213.

Barrier ribs 212 of a stripe type, a well type, a delta type, a honeycomb type, etc. may be formed on the lower dielectric layer 215 to provide discharge spaces (i.e., discharge cells). Hence, a first discharge cell emitting red light, a second discharge cell emitting blue light, and a third discharge cell emitting green light, etc. may be formed between the front substrate 201 and the back substrate 211.

The address electrode 213 may cross the scan electrode 202 and the sustain electrode 203 in one discharge cell. Namely, each discharge cell is formed at a crossing of the scan electrode 202, the sustain electrode 203, and the address electrode 213.

Each of the discharge cells provided by the barrier ribs 212 may be filled with a predetermined discharge gas.

A phosphor layer 214P may be formed inside the discharge cells to emit visible light for an image display during an address discharge. For example, first, second, and third phosphor layers that respectively generate red, blue, and green light may be fooled inside the discharge cells.

While the address electrode 213 may have a substantially constant width or thickness, a width or thickness of the address electrode 213 inside the discharge cell may be different from a width or thickness of the address electrode 213 outside the discharge cell. For example, a width or thickness of the address electrode 213 inside the discharge cell may be greater than a width or thickness of the address electrode 213 outside the discharge cell.

When a predetermined signal is supplied to at least one of the scan electrode 202, the sustain electrode 203, and the address electrode 213, a discharge may occur inside the discharge cell. The discharge may allow the discharge gas filled in the discharge cell to generate ultraviolet rays. The ultraviolet rays may be incident on phosphor particles of the phosphor layer 214P, and then the phosphor particles may emit visible light. Hence, an image may be displayed on the screen of the plasma display panel 100.

An image frame for achieving a gray scale of an image displayed on the plasma display panels 100, 110, 120, and 130 is described with reference to FIG. 4.

As shown in FIG. 4, an image frame for achieving a gray scale of an image may include a plurality of subfields. Each of the plurality of subfields may be divided into an address period and a sustain period. During the address period, the discharge cells not to generate a discharge may be selected or the discharge cells to generate a discharge may be selected. During the sustain period, a gray scale may be achieved depending on the number of discharges.

For example, if an image with 256-gray level is to be displayed, as shown in FIG. 4, an image frame may be divided into 8 subfields SF1 to SF8. Each of the 8 subfields SF1 to SF8 may include an address period and a sustain period.

Alternatively, at least one of the plurality of subfields of the image frame may further include a reset period for initialization. Alternatively, at least one of the plurality of subfields of the image frame may not include a sustain period.

The number of sustain signals supplied during the sustain period may determine a gray level of each of the subfields. For example, in such a method of setting a gray level of a first subfield at $2^0$ and a gray level of a second subfield at $2^1$, the sustain period increases in a ratio of $2^n$ (where, n=0, 1, 2, 3, 4, 5, 6, 7) in each of the subfields. Hence, various gray levels of an image may be achieved by controlling the number of sustain signals supplied during the sustain period of each subfield depending on a gray level of each subfield.

Although FIG. 4 shows that one image frame includes 8 subfields, the number of subfields constituting the image frame may vary. For example, the image frame may include 10 or 12 subfields. Further, although FIG. 4 shows that the subfields of the image frame are arranged in increasing order of gray level weight, the subfields may be arranged in decreasing order of gray level weight or may be arranged regardless of gray level weight.

A driving waveform for driving the plasma display panel is illustrated in FIG. 5.

As shown in FIG. 5, a reset signal RS may be supplied to the scan electrode Y during a reset period RP for initialization of at least one of a plurality of subfields of an image frame. The reset signal RS may include a ramp-up signal RU with a gradually rising voltage and a ramp-down signal RD with a gradually falling voltage.

More specifically, the ramp-up signal RU may be supplied to the scan electrode Y during a setup period of the reset period RP, and the ramp-down signal RD may be supplied to the scan electrode Y during a set-down period following the setup period SU. The ramp-up signal RU may generate a weak dark discharge (i.e., a setup discharge) inside the discharge cells. Hence, the wall charges may be uniformly distributed inside the discharge cells. The ramp-down signal RD subsequent to the ramp-up signal RU may generate a weak erase discharge (i.e., a set-down discharge) inside the discharge cells. Hence, the remaining wall charges may be uniformly distributed inside the discharge cells to the extent that an address discharge occurs stably.

During an address period AP following the reset period RP, a scan reference signal Ybias having a voltage greater than a minimum voltage of the ramp-down signal RD may be supplied to the scan electrode Y. In addition, a scan signal Sc falling from a voltage of the scan reference signal Ybias may be supplied to the scan electrode Y.

A pulse width of a scan signal supplied to the scan electrode during an address period of at least one subfield of an image frame may be different from pulse widths of scan signals supplied during address periods of the other subfields of the image frame. A pulse width of a scan signal in a subfield may be greater than a pulse width of a scan signal in a next subfield. For example, a pulse width of the scan signal may be gradually reduced in the order of 2.6 μs, 2.3 μs, 2.1 μs, 1.9 μs, etc. or may be reduced in the order of 2.6 μs, 2.3 μs, 2.3 μs, 2.1 μs, . . . , 1.9 μs, 1.9 μs, etc. in the successively arranged subfields.

As above, when the scan signal Sc is supplied to the scan electrode Y, a data signal Dt corresponding to the scan signal Sc may be supplied to the address electrode X. As a voltage difference between the scan signal Sc and the data signal Dt is added to a wall voltage obtained by the wall charges produced during the reset period RP, an address discharge may occur inside the discharge cell to which the data signal Dt is supplied. In addition, during the address period AP, a sustain reference signal Zbias may be supplied to the sustain electrode Z, so that the address discharge efficiently occurs between the scan electrode Y and the address electrode X.

During a sustain period SP following the address period AP, a sustain signal SUS may be supplied to at least one of the scan electrode Y or the sustain electrode Z. For example, the sustain signal SUS may be alternately supplied to the scan electrode Y and the sustain electrode Z. Further, the address electrode X may be electrically floated during the sustain period SP. As the wall voltage inside the discharge cell selected by performing the address discharge is added to a sustain voltage Vs of the sustain signal SUS, every time the sustain signal SUS is supplied, a sustain discharge, i.e., a display discharge may occur between the scan electrode Y and the sustain electrode Z.

As described above, each of the first to fourth filters 210A-210D respectively positioned on the front surfaces of the first to fourth plasma display panels 100, 110, 120, and 130 may include the electromagnetic shielding layer.

Figure 6:
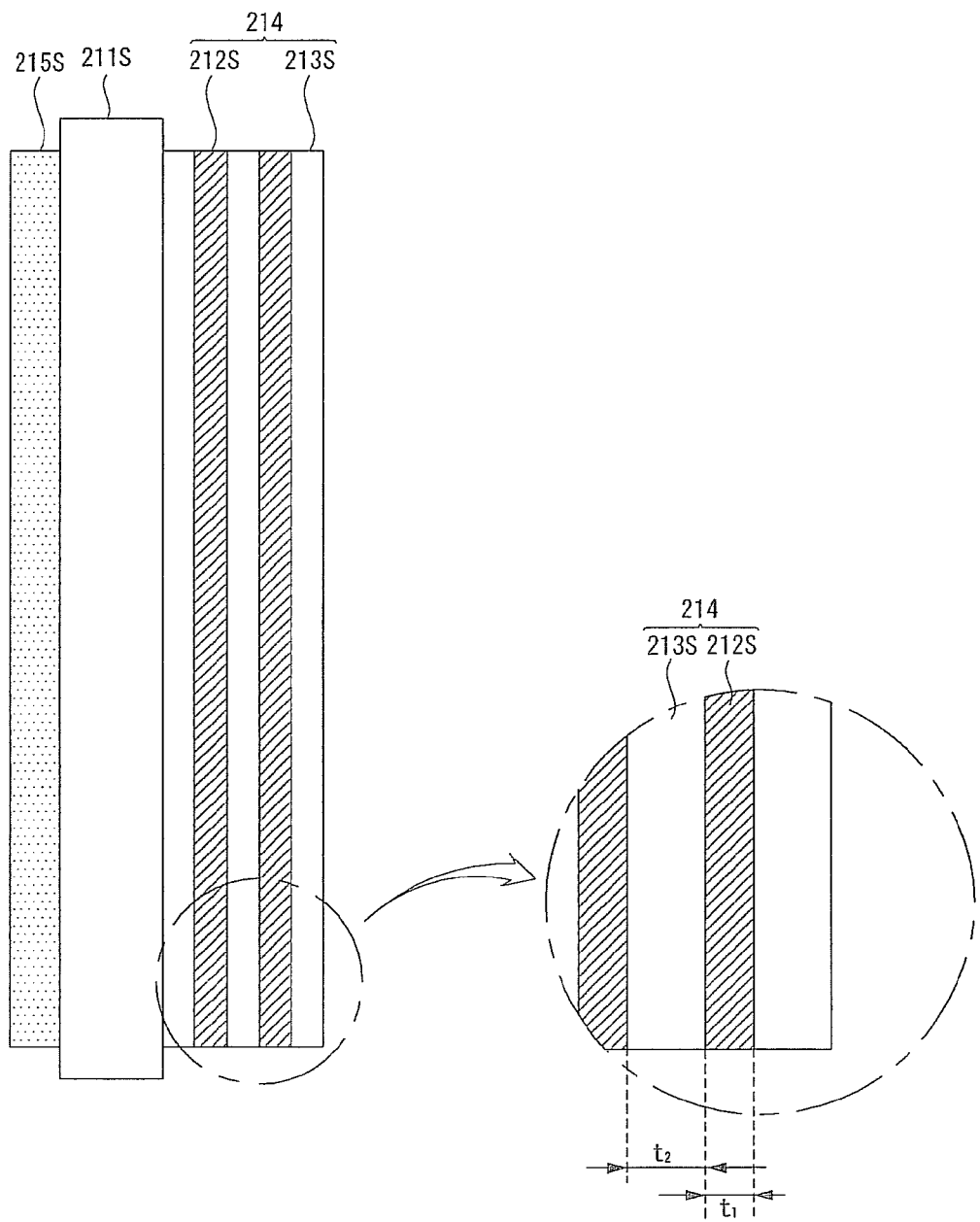

As shown in FIG. 6, each of the first to fourth filters 210A-210D may include a substrate 211S, an electromagnetic shielding layer 214, and other function layer 215S. Each of the first to fourth filters 210A-210D may further include an adhesive layer (not shown) between the substrate 211S and the electromagnetic shielding layer 214S and/or between the substrate 211S and the other function layer 215S.

The electromagnetic shielding layer 214S may include a plurality of transparent electrode layers 213S and a plurality of metal electrode layers 212S. The plurality of transparent electrode layers 213S and the plurality of metal electrode layers 212S may be alternatively positioned, i.e., stacked. The electromagnetic shielding layer 214S having the above-described structure may be referred to as a sputter type electromagnetic shielding layer. The sputter structure may mean a structure in which two or more conductive layers are stacked.

The transparent electrode layers 213S may be formed of a transparent material with electrical conductivity, for example, indium-tin-oxide (ITO). The metal electrode layers 212S may be formed of a material with excellent electrical conductivity, for example, silver (Ag). When the transparent electrode layers 213S and the metal electrode layers 212S with the excellent electrical conductivity are alternatively stacked, a light transmittance and the electrical conductivity may be improved. Hence, the electromagnetic shielding layer 214 may sufficiently absorb charges generating electromagnetic waves and may reduce electromagnetic interference (EMI). As a result, a reduction in a luminance of the image displayed on the plasma display panels 100, 110, 120, and 130 may be prevented.

A thickness t2 of the transparent electrode layer 213S may be set to about 300 Å to 800 Å and a thickness t1 of the metal electrode layer 212S may be set to about 100 Å to 200 Å, so as to keep the light transmittance at a sufficient high level.

Further, the other function layer 215S may be a near-infrared shielding layer that absorbs or reflects near-infrared rays to shield the near-infrared rays. Alternatively, the other function layer 215S may be a color layer, an anti-glare layer, or an anti-reflection layer. As shown in FIG. 7(a), each of the filters 210A-210D may include the substrate 211S and the electromagnetic shielding layer 214 including a mesh type metal layer 216. Namely, the mesh type metal layer 216 may be the electromagnetic shielding layer. The mesh type metal layer 216 may sufficiently absorb charges generating electromagnetic waves and may reduce electromagnetic interference (EMI).

A color of the mesh type metal layer 216 may be darker than a color of the substrate 211S, so that light is prevented from being reflected by the mesh type metal layer 216. For example, light may be prevented from being reflected by the mesh type metal layer 216 by applying an upper portion of the mesh type metal layer 216 with a black carbon material. Alternatively, the mesh type metal layer 216 may absorb interference light emitted from the plasma display panel by applying a lower portion of the mesh type metal layer 216 with a black material.

As shown in FIG. 7(b), a line width Si of the mesh type metal layer 216 may be approximately 10 μm to 30 μm. A shortest distance S2 between lines of the mesh type metal layer 216 may be approximately 200 μm to 300 μm.

FIGS. 8 to 22 illustrate a structure of a multi display device according to another exemplary embodiment of the invention. Structures and components identical or equivalent to those described in FIGS. 1 to 7 are designated with the same reference numerals, and a further description may be briefly made or may be entirely omitted. For example, the exemplary embodiment of the invention uses a plasma display panel as a display panel. However, other kinds of displays panels other than the plasma display panel may be used as long as a frame is positioned on a back surface of the displays panel.

Figure 8:
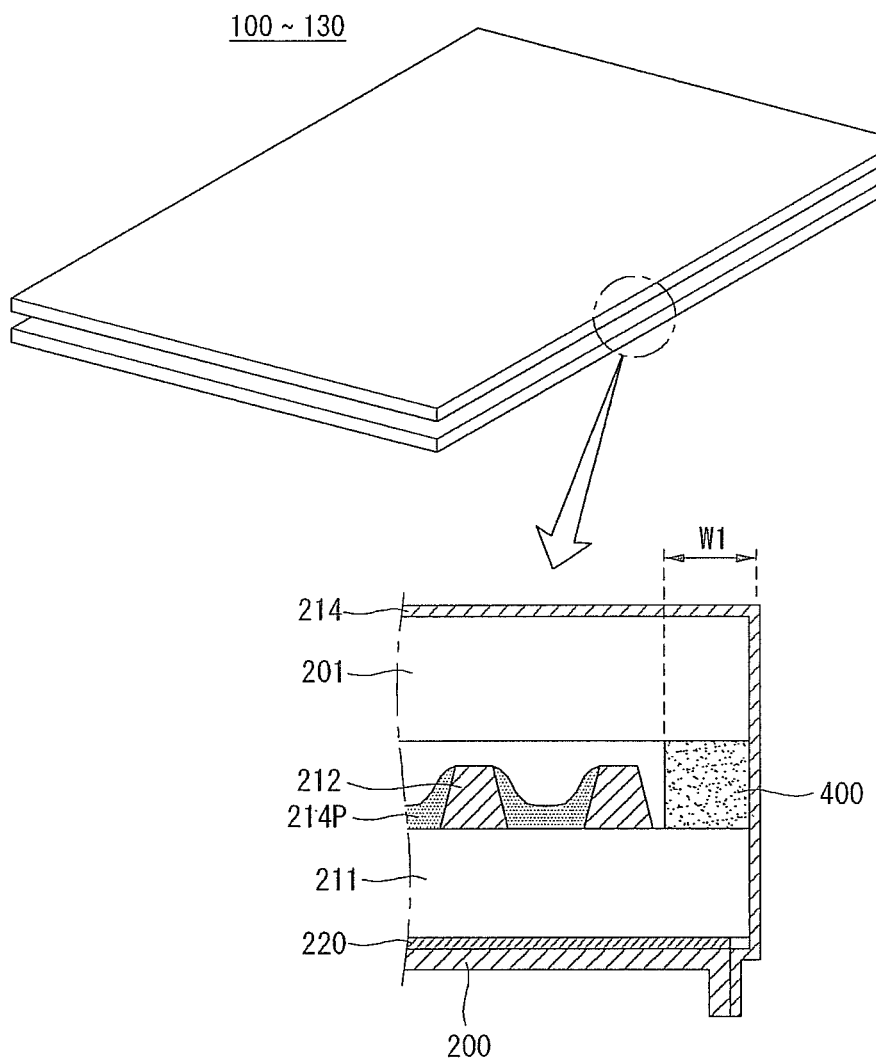

As shown in FIG. 8, each of a plurality of plasma display panels 100, 110, 120, and 130 may include a front substrate 201, a back substrate 211 positioned opposite the front substrate 201, and a seal layer 400 between the front substrate 201 and the back substrate 211. The seal layer 400 may attach the front substrate 201 to the back substrate 211.

An electromagnetic shielding layer 214 may be positioned on a front surface of the front substrate 201 of each of the plasma display panels 100, 110, 120, and 130. The electromagnetic shielding layer 214 may include a metal layer for shielding electromagnetic waves. As described above, a filter may be positioned on the front surface of the front substrate 201.

A frame 200 may be positioned on a back surface of the back substrate 211 of each of the plasma display panels 100, 110, 120, and 130.

The electromagnetic shielding layer 214 may extend to the frame 200. In other words, a portion of the electromagnetic shielding layer 214 may contact the frame 200. Hence, the electromagnetic shielding layer 214 may be electrically connected to the frame 200. Further, when the plasma display panels 100, 110, 120, and 130 are driven, because charges collected by the electromagnetic shielding layer 214 may move to the frame 200 corresponding to a ground, the electromagnetic waves may be shielded.

Because the extending portion of the electromagnetic shielding layer 214 extending to the frame 200 contacts the side of each of the plasma display panels 100, 110, 120, and 130 as well as the frame 200, the size of an area W1 on which an image is not displayed may be reduced. Namely, the size of a bezel area on which the image is not displayed may be reduced.

Figure 9:
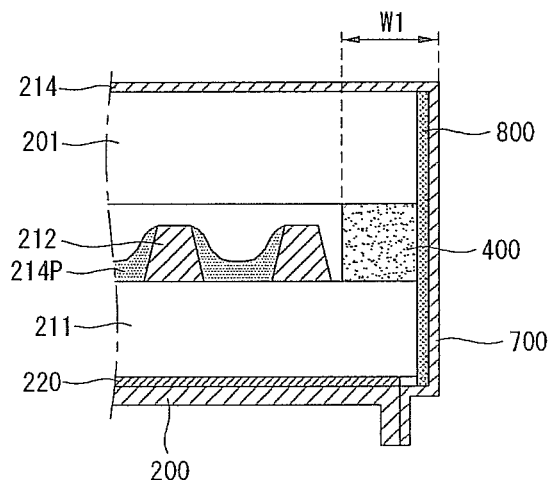
Figure 10:
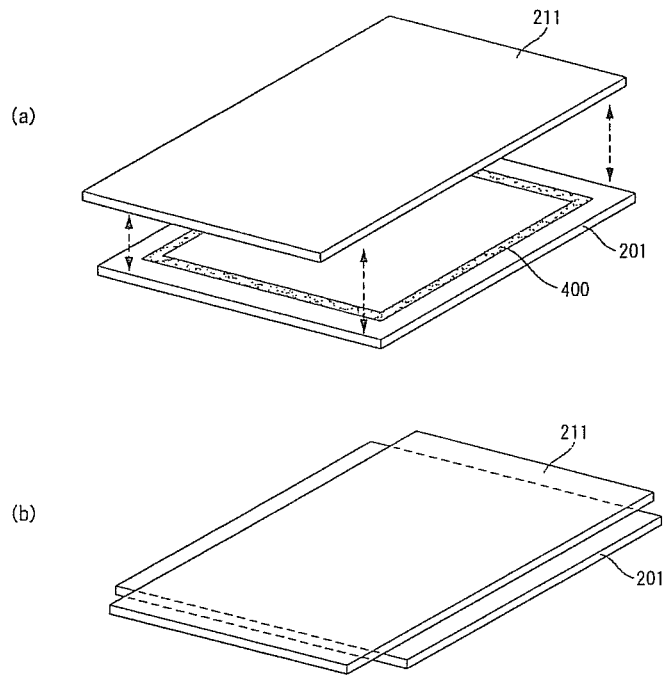

Further, as shown in FIG. 9, a buffer layer 800 may be positioned between the side of a seal layer 400 of each of the plasma display panels 100, 110, 120, and 130 and the extending portion of the electromagnetic shielding layer 214. Alternatively, the buffer layer 800 may be positioned between the side of the front substrate 201 and the extending portion of the electromagnetic shielding layer 214. Alternatively, the buffer layer 800 may be positioned between the side of the back substrate 211 and the extending portion of the electromagnetic shielding layer 214.

The buffer layer 800 may be formed of a resin material and may be attached to the side of each of the plasma display panels 100, 110, 120, and 130 in a sheet form. The buffer layer 800 may fix the extending portion of the electromagnetic shielding layer 214 to prevent the disconnection between the electromagnetic shielding layer 214 and the frame 200.

Further, the buffer layer 800 may have an adhesion. In this instance, because the extending portion of the electromagnetic shielding layer 214 is closely attached to the side of each of the plasma display panels 100, 110, 120, and 130, the size of the bezel area on which the image is not displayed may be further reduced. The buffer layer 800 having the adhesion may be referred to as an adhesive layer. The buffer layer 800 may be omitted, if desired.

A method for manufacturing the multi display device having the above-described structure is described below.

As shown in FIG. 10(a), the seal layer 400 may be formed at an edge of at least one of the front substrate 201 and the back substrate 211. As shown in FIG. 10(b), the seal layer 400 may attach the front substrate 201 to the back substrate 211.

Subsequently, an exhaust tip (not shown) may be connected to an exhaust hole (not shown), and an exhaust pump (not shown) may be connected to the exhaust tip. The exhaust pump may exhaust an impurity gas remaining in a discharge space between the front substrate 201 and the back substrate 211 to the outside and may inject a discharge gas, such as argon (Ar), neon (Ne), and xenon (Xe), into the discharge space. The discharge space between the front substrate 201 and the back substrate 211 may be sealed through the above-described method.

Subsequently, as shown in FIG. 11(a), a portion of each of the front substrate 201 and the back substrate 211, that are attached to each other, may be cut along a first cutting line CL1. A grinding process may be performed along with the cutting process. Hence, as shown in FIG. 11(b), the cutting process may prevent at least one of the front substrate 201 and the back substrate 211 from excessively protruding. As a result, the size of a portion of the plasma display panel, on which the image is not displayed, may be reduced.

The seal layer 400 may be cut in the cutting process of the front substrate 201 and the back substrate 211 illustrated in FIG. 11(a). As above, when the seal layer 400 is cut, the size of the portion of the plasma display panel, on which the image is not displayed, may be reduced.

Subsequently, as shown in FIG. 11(c), the electromagnetic shielding layer 214 may be positioned on the front surface of the front substrate 201, and the frame 200 may be positioned on the back surface of the back substrate 211. Then, a portion of the electromagnetic shielding layer 214 may be connected to the frame 200. The electromagnetic shielding layer 214 may be grounded through the simple process for connecting the portion of the electromagnetic shielding layer 214 to the frame 200.

As illustrated in FIGS. 11(a) to 11(c), when the portion of each of the front substrate 201 and the back substrate 211 is cut, a shortest distance between the electromagnetic shielding layer 214 on the front surface of the front substrate 201 and the frame 200 on the back surface of the back substrate 211 may be reduced. Hence, the electromagnetic shielding layer 214 on the front surface of the front substrate 201 may be more easily connected to the frame 200 on the back surface of the back substrate 211.

A half cutting method may be used to form the extending portion of the electromagnetic shielding layer 214 included in a filter. This is described below with reference to FIG. 12.

As shown in FIG. 12(a), a filter 210 may include a first base layer 500, the electromagnetic shielding layer 214 positioned on the first base layer 500, a pressure sensitive adhesive (PSA) layer 510 positioned on the electromagnetic shielding layer 214, a color/near-infrared layer 520, a second base layer 530, an anti-reflection layer 540, and a protective layer 550.

The electromagnetic shielding layer 214 may protrude by a predetermined length by cutting the first base layer 500 along a second cutting line CL2. As above, the method for cutting not the electromagnetic shielding layer 214 but the first base layer 500 may be referred to as the half cutting method.

As shown in FIG. 12(b), the protruding portion (i.e., the extending portion) of the electromagnetic shielding layer 214 formed using the half cutting method may be connected to the frame 200.

The extending portions of the electromagnetic shielding layers positioned on the front surfaces of the two adjacent display panels may be positioned between the two adjacent display panels.

Figure 13:
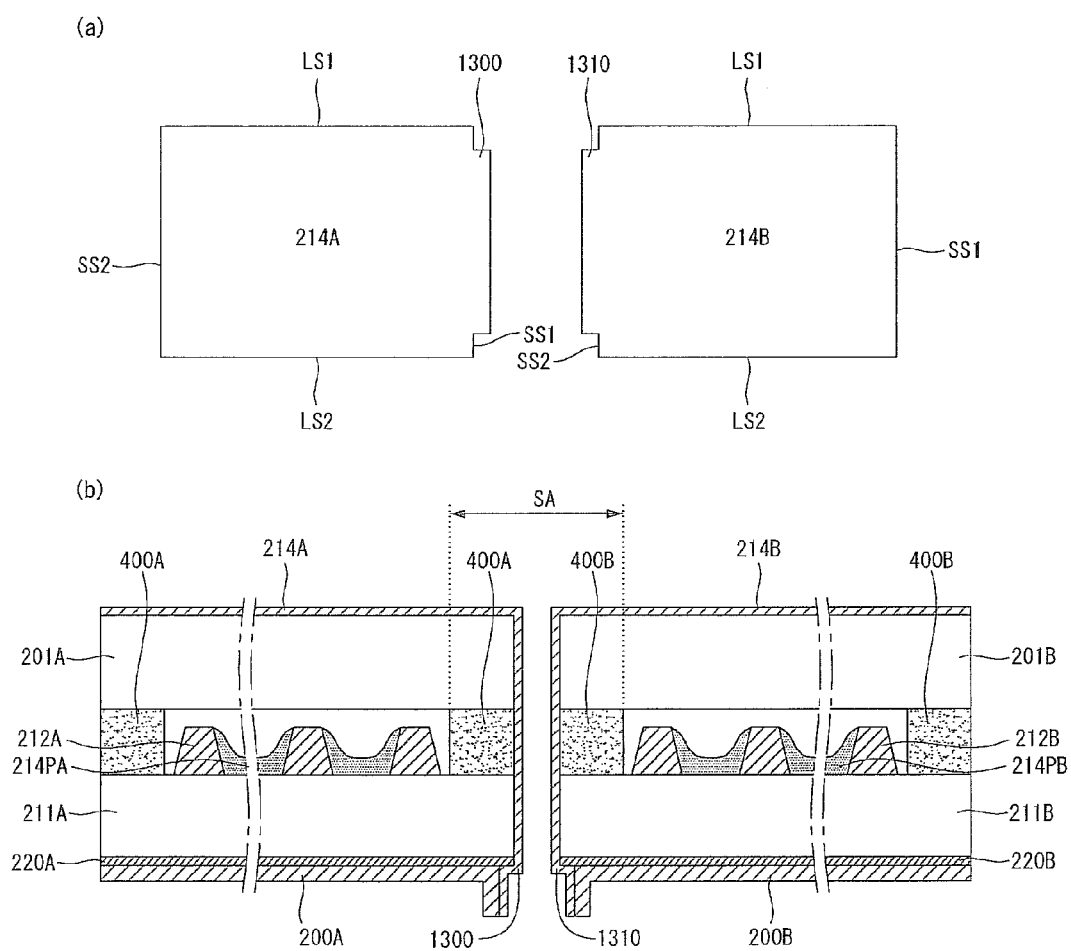

More specifically, as shown in FIG. 13, a protrusion 1300 of a first electromagnetic shielding layer 214A positioned on the front surface of the first panel 100 of the multi display device and a protrusion 1310 of a second electromagnetic shielding layer 214B positioned on the front surface of the second panel 110 may be positioned between the first panel 100 and the second panel 110. In this instance, the protrusion 1300 of the first electromagnetic shielding layer 214A may be adjacent to the protrusion 1310 of the second electromagnetic shielding layer 214B.

The protrusion 1300 of the first electromagnetic shielding layer 214A may extend to a first frame 200A positioned on the back surface of the first panel 100 and may be connected to the first frame 200A. The protrusion 1310 of the second electromagnetic shielding layer 214B may extend to a second frame 200B positioned on the back surface of the second panel 110 and may be connected to the second frame 200B. Namely, the protrusions 1300 and 1310 of the first and second electromagnetic shielding layers 214A and 214B may be extending portions extending to the first and second frames 200A and 200B.

When each of the first and second electromagnetic shielding layers 214A and 214B has a rectangular shape, the protrusion 1300 of the first electromagnetic shielding layer 214A may be positioned on one side of the first electromagnetic shielding layer 214A, and the protrusion 1310 of the second electromagnetic shielding layer 214B may be positioned on one side of the second electromagnetic shielding layer 214B. For example, the protrusion 1300 of the first electromagnetic shielding layer 214A may be positioned on a second long side LS2 of the first electromagnetic shielding layer 214A, and the protrusion 1310 of the second electromagnetic shielding layer 214B may be positioned on a second long side LS2 of the second electromagnetic shielding layer 214B.

Figure 14:
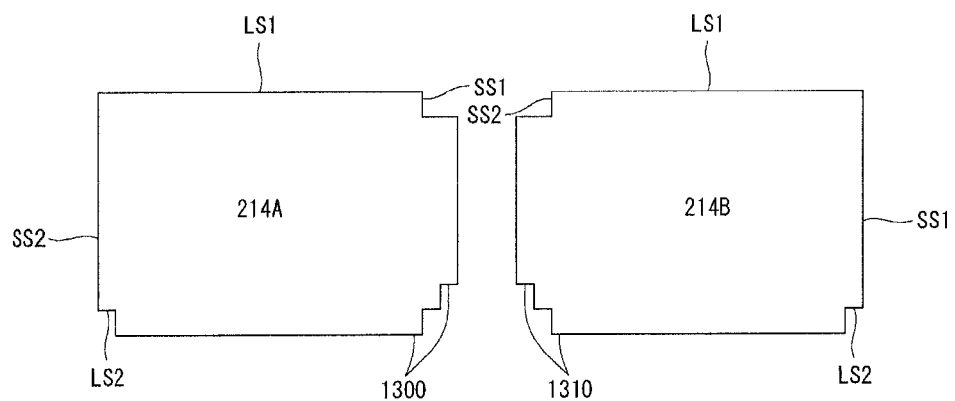

Alternatively, the protrusion of the electromagnetic shielding layer may be positioned on at least two sides of the electromagnetic shielding layer. More specifically, as shown in FIG. 14, the protrusion 1300 of the first electromagnetic shielding layer 214A may be positioned on a first short side SS1 and the second long side LS2 of the first electromagnetic shielding layer 214A. The protrusion 1310 of the second electromagnetic shielding layer 214B may be positioned on a second short side SS2 and the second long side LS2 of the second electromagnetic shielding layer 214B.

Alternatively, the protrusion of one of the two electromagnetic shielding layers corresponding to the two adjacent display panels may be positioned between the two adjacent display panels, and the protrusion of the other may be positioned at other location.

Figure 15:
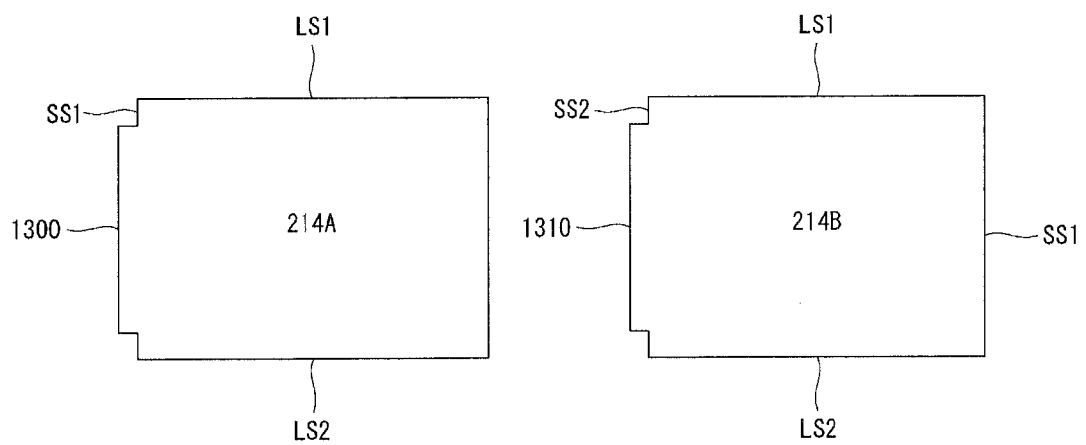

More specifically, as shown in FIG. 15, the protrusion 1300 of the first electromagnetic shielding layer 214A may be positioned on the first short side SS1 of the first electromagnetic shielding layer 214A. The protrusion 1310 of the second electromagnetic shielding layer 214B may be positioned on the second short side SS2 of the second electromagnetic shielding layer 214B. The second short side SS2 of the first electromagnetic shielding layer 214A may be adjacent to the second short side SS2 of the second electromagnetic shielding layer 214B, and the second short side SS2 of the first electromagnetic shielding layer 214A may be positioned opposite the first short side SS1 of the first electromagnetic shielding layer 214A.

Figure 16:
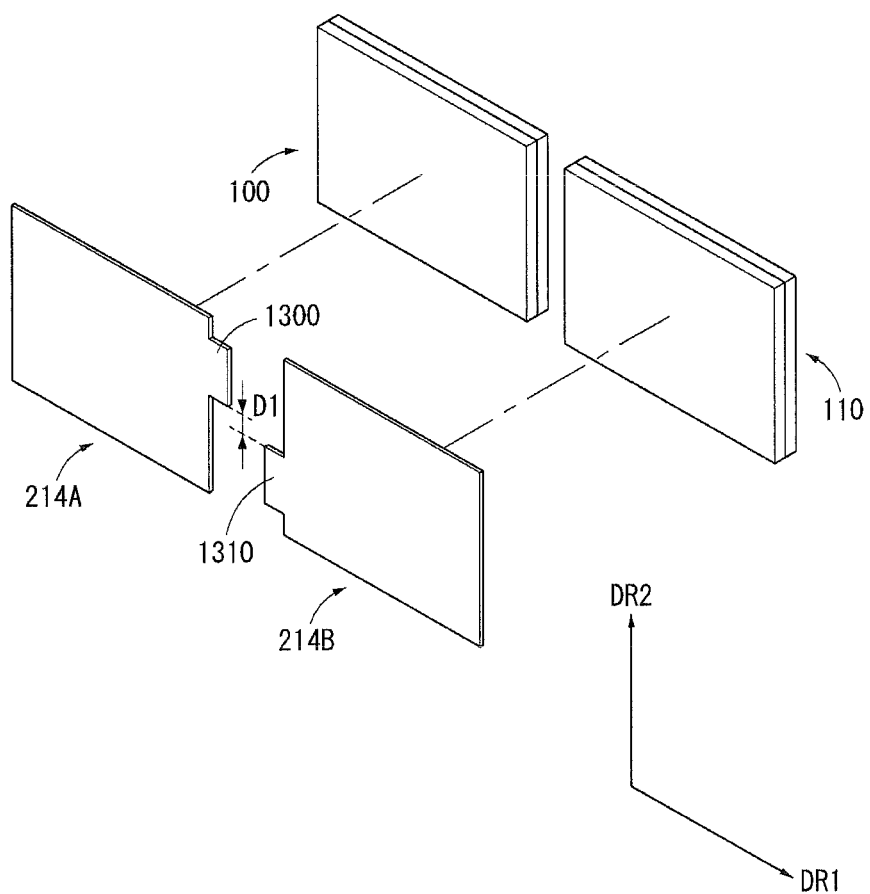

The extending portions of the electromagnetic shielding layers positioned on the front surfaces of the two adjacent display panels may be staggered. More specifically, as shown in FIG. 16, the protrusion 1300 of the first electromagnetic shielding layer 214A positioned on the front surface of the first panel 100 and the protrusion 1310 of the second electromagnetic shielding layer 214B positioned on the front surface of the second panel 110 may be staggered.

Preferably, when the first panel 100 and the second panel 110 are positioned adjacent to each other in a first direction DR1, the protrusion 1300 of the first electromagnetic shielding layer 214A and the protrusion 1310 of the second electromagnetic shielding layer 214B may be spaced apart from each other at a predetermined distance D1 in a second direction DR2 crossing the first direction DR1.

Figure 17:
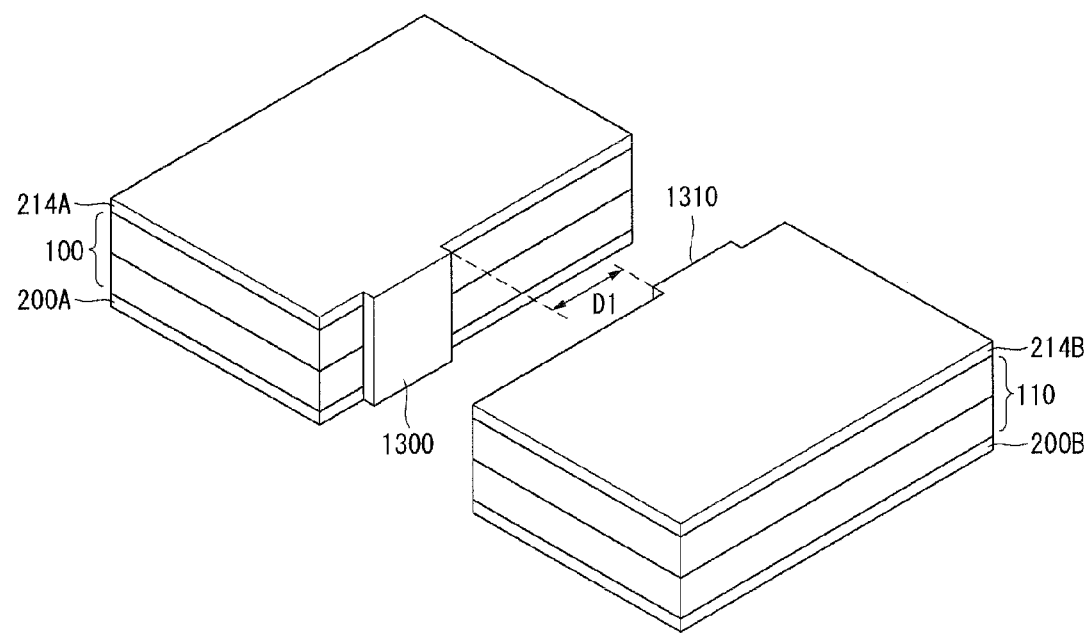

As shown in FIG. 17, when the protrusion 1300 of the first electromagnetic shielding layer 214A is positioned at the side of the first panel 100 and the protrusion 1310 of the second electromagnetic shielding layer 214B is positioned at the side of the second panel 110, the protrusions 1300 and 1310 of the first and second electromagnetic shielding layers 214A and 214B may be positioned between the first panel 100 and the second panel 110.

Further, the protrusion 1300 of the first electromagnetic shielding layer 214A may not contact the protrusion 1310 of the second electromagnetic shielding layer 214B in the state where the protrusion 1300 of the first electromagnetic shielding layer 214A is positioned at the side of the first panel 100 and the protrusion 1310 of the second electromagnetic shielding layer 214B is positioned at the side of the second panel 110. Hence, the size of a seam area SA between the first panel 100 and the second panel 110 may be reduced. This is described below with reference to FIG. 18.

Figure 18:
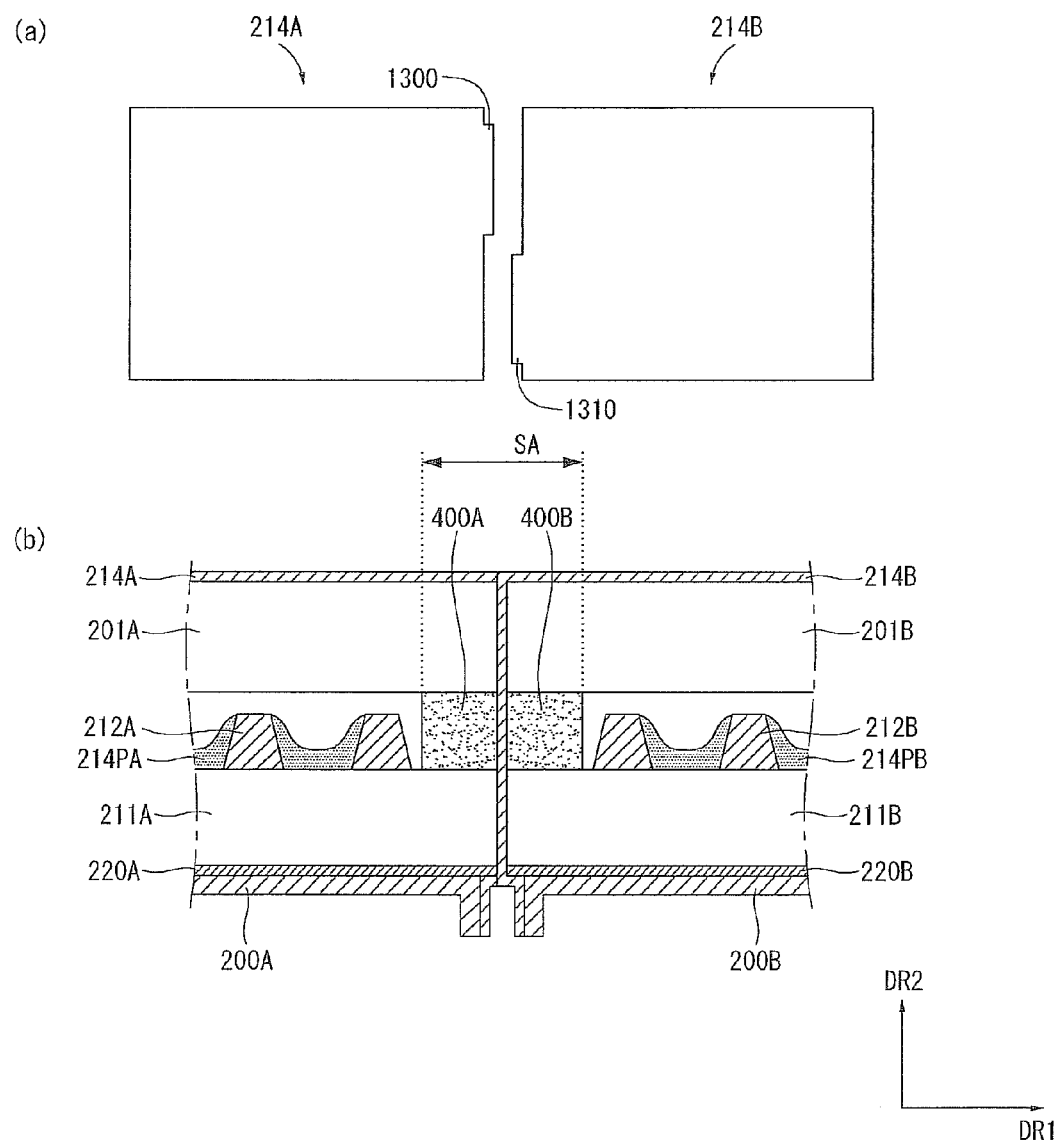

As shown in FIG. 18, the first electromagnetic shielding layer 214A may extend to the first frame 200A in a boundary portion (i.e., the seam area SA) between the two plasma display panels, for example, the first and second panels 100 and 110. Namely, the protrusion 1300 of the first electromagnetic shielding layer 214A may contact the first frame 200A. Further, the second electromagnetic shielding layer 214B may extend to the second frame 200B in the seam area SA between the first and second panels 100 and 110. Namely, the protrusion 1310 of the second electromagnetic shielding layer 214B may contact the second frame 200B.

Because the protrusion 1300 of the first electromagnetic shielding layer 214A and the protrusion 1310 of the second electromagnetic shielding layer 214B are separated from each other in the second direction DR2, it may look like that the protrusion 1300 of the first electromagnetic shielding layer 214A overlaps the protrusion 1310 of the second electromagnetic shielding layer 214B when viewed the seam area SA at the side of the first and second panels 100 and 110. Hence, the size of the seam area SA between the first and second panels 100 and 110 may be further reduced.

Figure 11:
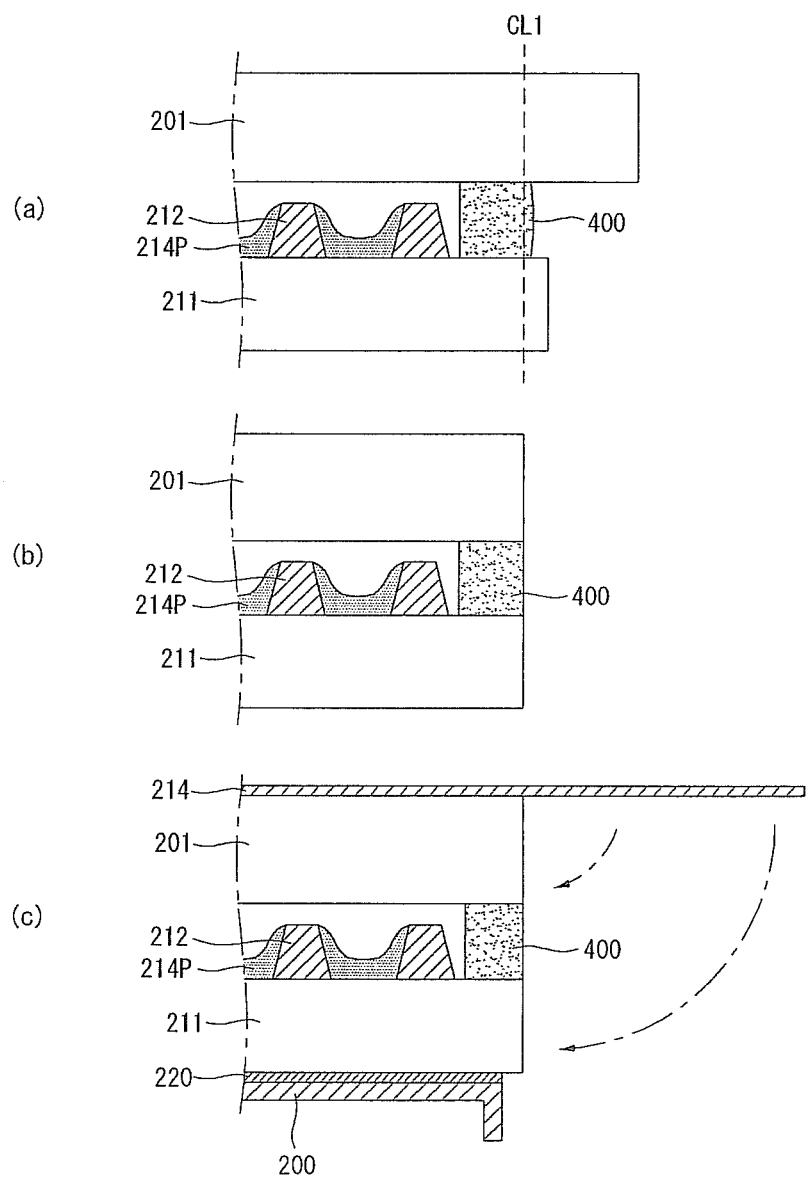

The portion of each of the first and second panels 100 and 110 may be cut and ground in the seam area SA between the first and second panels 100 and 110 as illustrated in FIG. 11. Hence, the first electromagnetic shielding layer 214A may easily extend to the first frame 200A in the seam area SA, and the second electromagnetic shielding layer 214B may easily extend to the second frame 200B in the seam area SA. Further, the size of the seam area SA, on which the image is not displayed, may be reduced. As a result, the multi display device according to the embodiment of the invention may display a natural image.

Alternatively, the electromagnetic shielding layer 214 may not extend to the frame 200 and may extend to only the side of the display panel.

Figure 19:
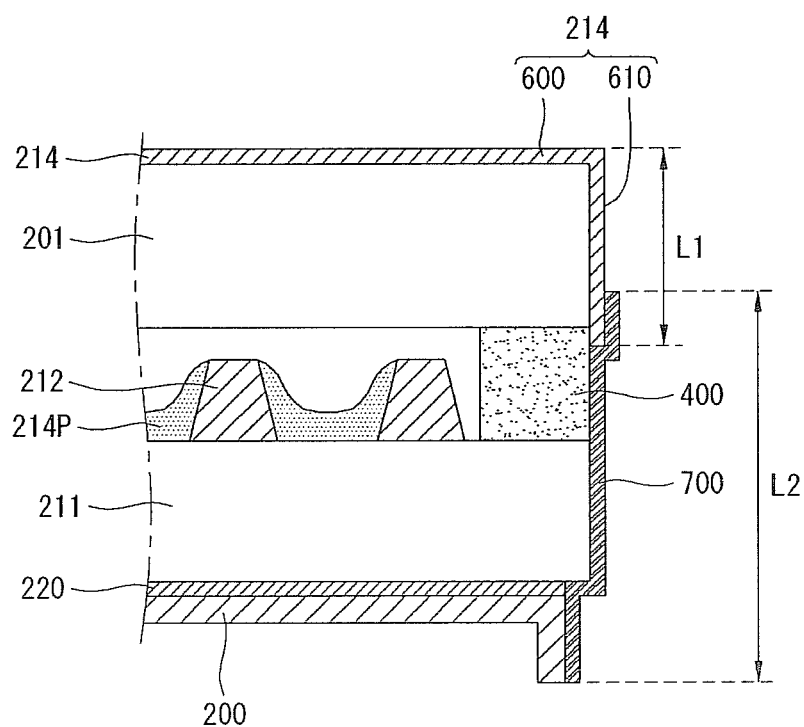

More specifically, as shown in FIG. 19, the electromagnetic shielding layer 214 may include a first portion 600 positioned on the front surface of the display panel and a second portion 610 positioned on the side of the display panel. The second portion 610 may include a portion positioned on the side of the front substrate 201. The second portion 610 may include a portion positioned on the side of the seal layer 400. In FIG. 8, the second portion 610 of the electromagnetic shielding layer 214 may extend to the frame 200. In FIG. 16, the protrusions 1300 and 1310 may be the second portion 610.

In this instance, the first portion 600 of the electromagnetic shielding layer 214 may have a rectangular shape.

A conductive part 700 may be formed between the second portion 610 of the electromagnetic shielding layer 214 and the frame 200. The conductive part 700 may connect the second portion 610 of the electromagnetic shielding layer 214 to the frame 200. Hence, the electromagnetic shielding layer 214 may be grounded. The conductive part 700 may be a conductive tape.

As shown in FIG. 19, when the second portion 610 of the electromagnetic shielding layer 214 is connected to the frame 200 using the conductive part 700, a length L1 of the second portion 610 may be less than a length L2 of the conductive part 700. This is because the attaching process of the conductive part 700 is simpler than the formation process of the second portion 610 of the electromagnetic shielding layer 214.

Further, when the second portion 610 of the electromagnetic shielding layer 214 is connected to the frame 200 using the conductive part 700, the conductive parts 700 positioned on the sides of the two adjacent plasma display panels may be staggered.

Figure 20:
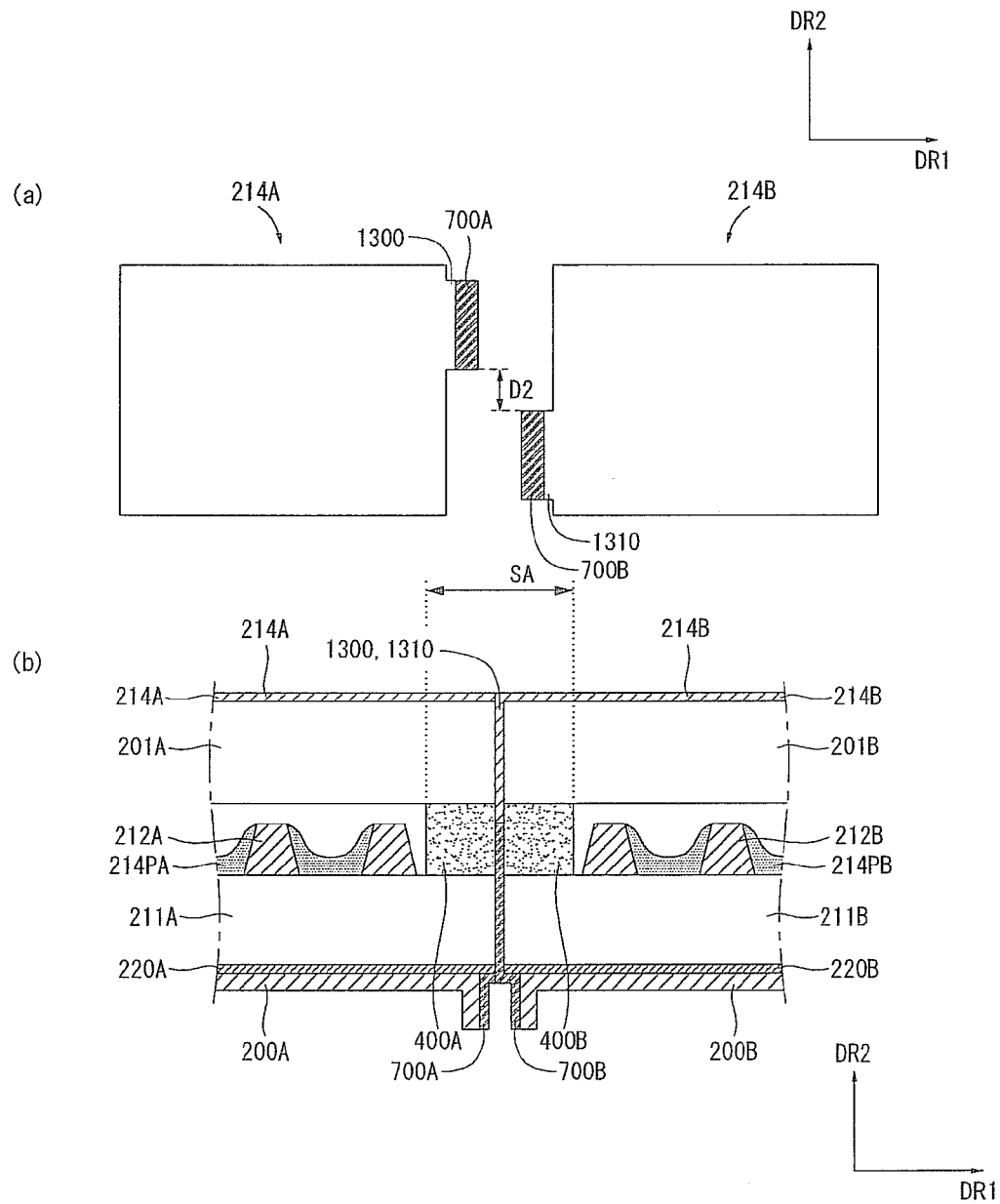

More specifically, as shown in FIG. 20, the first electromagnetic shielding layer 214A may include a first portion 600A positioned on the front surface of the first panel 100 and a second portion 610A positioned on the side of the first panel 100 in the seam area SA. Further, the second electromagnetic shielding layer 214B may include a first portion 600B positioned on the front surface of the second panel 110 and a second portion 610B positioned on the side of the second panel 110 in the seam area SA. The second portions 610A and 610B may include portions positioned on the sides of the front substrates 201A and 201B, respectively. The second portions 610A and 610B may include a portion positioned on the sides of the seal layers 400A and 400B, respectively.

A first conductive part 700A may be formed between the second portion 610A of the first electromagnetic shielding layer 214A and the first frame 200A. A second conductive part 700B may be formed between the second portion 610B of the second electromagnetic shielding layer 214B and the second frame 200B. The first conductive part 700A may connect the second portion 610A of the first electromagnetic shielding layer 214A to the first frame 200A. The second conductive part 700B may connect the second portion 610B of the second electromagnetic shielding layer 214B to the second frame 200B. Hence, the first and second electromagnetic shielding layers 214A and 214B may be grounded.

The second portion 610A of the first electromagnetic shielding layer 214A and the second portion 610B of the second electromagnetic shielding layer 214B may be positioned between the first and second panels 100 and 110. Further, the first and second conductive parts 700A and 700B may be positioned between the first and second panels 100 and 110.

The first and second conductive parts 700A and 700B may be spaced apart from each other at a predetermined distance D2 in the second direction DR2. Hence, it may look like that the first and second conductive parts 700A and 700B overlap each other when viewed the seam area SA at the side of the first and second panels 100 and 110. Hence, the size of the seam area SA between the first and second panels 100 and 110 may be further reduced.

Alternatively, the electromagnetic shielding layer 214 may not include a portion positioned on the side of the plasma display panel.

Figure 21:
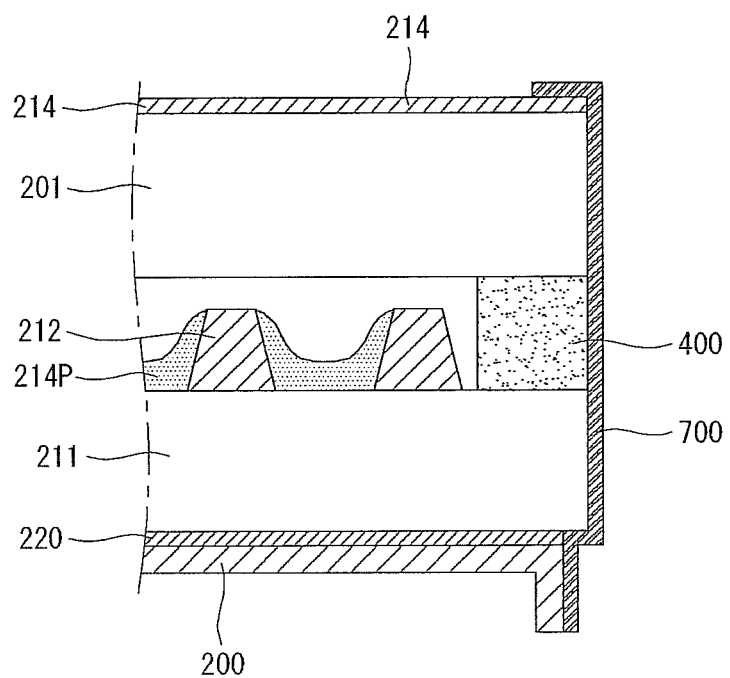

More specifically, as shown in FIG. 21, one end of the conductive part 700 positioned on the side of the plasma display panel may be connected to the side of the electromagnetic shielding layer 214. The other end of the conductive part 700 may be connected to the frame 200 positioned on the back surface of the plasma display panel. Preferably, the conductive part 700 and the electromagnetic shielding layer 214 may be connected to each other on the front surface of the plasma display panel.

In the multi display device having the above-described structure, the process for grounding the electromagnetic shielding layer 214 may be more easily performed.

As above, when the conductive part 700 and the electromagnetic shielding layer 214 are connected to each other on the front surface of the plasma display panel, the conductive parts 700 positioned on the sides of the two adjacent plasma display panels may be staggered.

Figure 22:
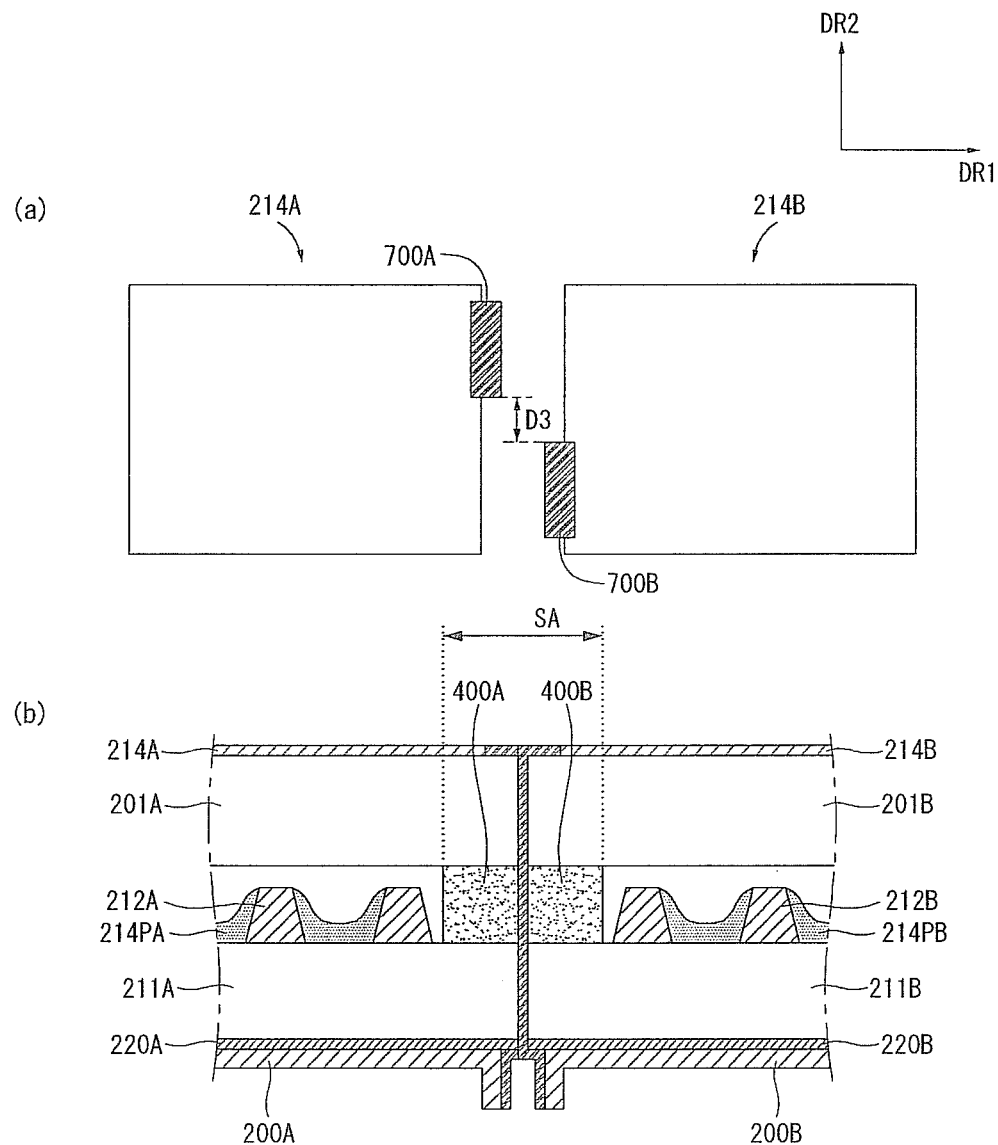

More specifically, as shown in FIG. 22, one end of the first conductive part 700A and the first electromagnetic shielding layer 214A may be connected to each other on the front surface of the first panel 100 in the seam area SA. The other end of the first conductive part 700A may be connected to the first frame 200A positioned on the back surface of the first panel 100 in the seam area SA. Further, one end of the second conductive part 700B and the second electromagnetic shielding layer 214B may be connected to each other on the front surface of the second panel 110 in the seam area SA. The other end of the second conductive part 700B may be connected to the second frame 200B positioned on the back surface of the second panel 110 in the seam area SA. Hence, the first and second electromagnetic shielding layers 214A and 214B may be grounded.

The first and second conductive parts 700A and 700B may be spaced apart from each other at a predetermined distance D3 in the second direction DR2. Hence, it may look like that the first and second conductive parts 700A and 700B overlap each other when viewed the seam area SA at the side of the first and second panels 100 and 110. Hence, the size of the seam area SA between the first and second panels 100 and 110 may be further reduced.

FIGS. 23 to 27 illustrate a structure of a multi display device according to another exemplary embodiment of the invention. Structures and components identical or equivalent to those described in FIGS. 1 to 22 are designated with the same reference numerals, and a further description may be briefly made or may be entirely omitted. For example, the exemplary embodiment of the invention illustrated in FIGS. 23 to 27 describes the structure, in which an electromagnetic shielding layer on a front surface of a plasma display panel extends to a frame on a back surface of the plasma display panel, for the sake of brevity. However, the exemplary embodiment of the invention illustrated in FIGS. 23 to 27 may be applied to the structure in which a conductive part is positioned on the side of the plasma display panel.

An electromagnetic shielding layer 214 may include a plurality of protrusions.

Figure 23:
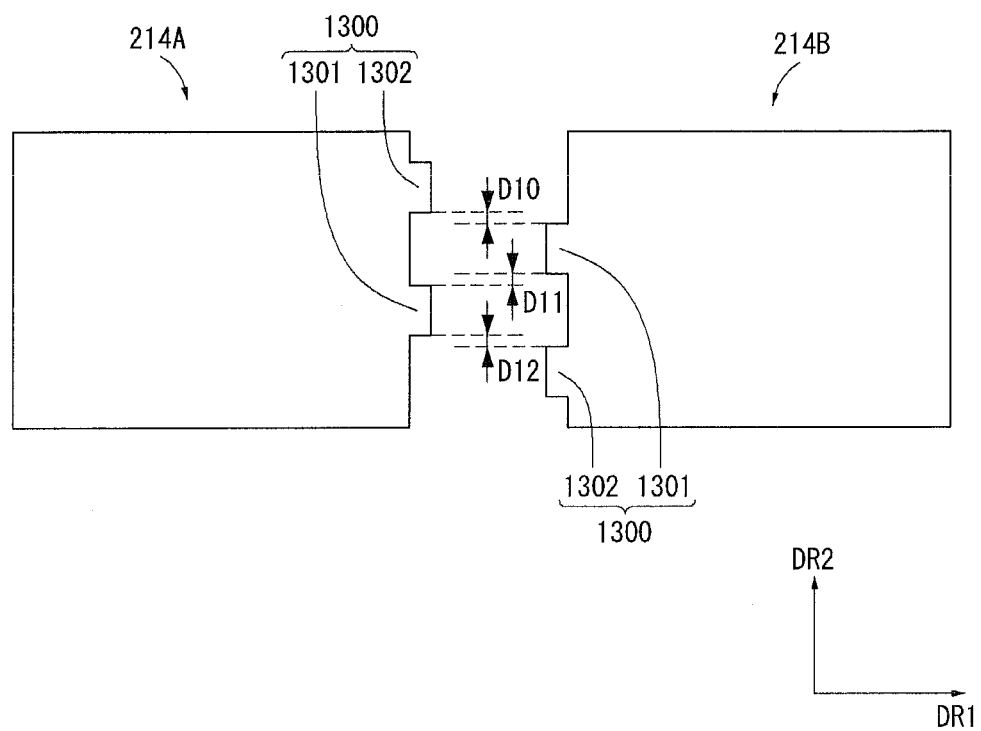

More specifically, as shown in FIG. 23, a first electromagnetic shielding layer 214A may include first and second protrusions 1301 and 1302, and a second electromagnetic shielding layer 214B may include first and second protrusions 1311 and 1312.

The first protrusion 1301 of the first electromagnetic shielding layer 214A and the first protrusion 1311 of the second electromagnetic shielding layer 214B may be spaced apart from each other at a predetermined distance D10 in a second direction DR2. The second protrusion 1302 of the first electromagnetic shielding layer 214A and the first protrusion 1311 of the second electromagnetic shielding layer 214B may be spaced apart from each other at a predetermined distance D11 in the second direction DR2. The second protrusion 1302 of the first electromagnetic shielding layer 214A and the second protrusion 1312 of the second electromagnetic shielding layer 214B may be spaced apart from each other at a predetermined distance D12 in the second direction DR2.

In other words, the first protrusion 1311 of the second electromagnetic shielding layer 214B may be spaced apart from the first and second protrusions 1301 and 1302 of the first electromagnetic shielding layer 214A at the predetermined distances D10 and D11 in an area between the first and second protrusions 1301 and 1302 of the first electromagnetic shielding layer 214A in the second direction DR2. In this instance, the size of a seam area SA between the two adjacent plasma display panels may be reduced.

Figure 24:
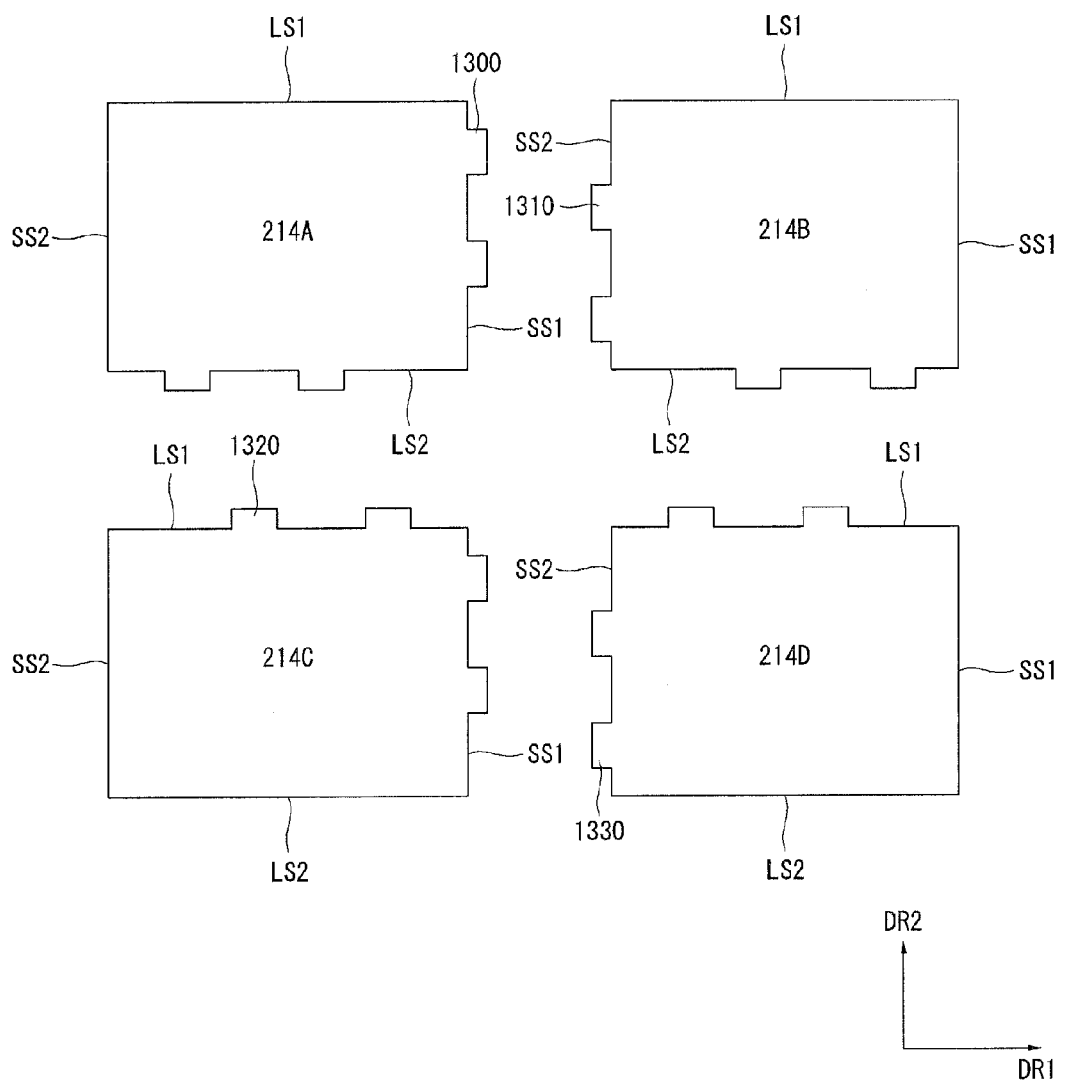

Alternatively, as shown in FIG. 24, when four plasma display panels are arranged in a matrix structure of 2×2, first to fourth electromagnetic shielding layers 214A-214D may be arranged in a matrix structure of 2×2 in the same manner as the plasma display panels.

A plurality of protrusions 1300 may be formed on each of a first short side SS1 and a second long side LS2 of the first electromagnetic shielding layer 214A. A plurality of protrusions 1310 may be formed on each of a second short side SS2 and a second long side LS2 of the second electromagnetic shielding layer 214B. A plurality of protrusions 1320 may be formed on each of a first short side SS1 and a first long side LS1 of the third electromagnetic shielding layer 214C. A plurality of protrusions 1330 may be formed on each of a second short side SS2 and a first long side LS1 of the fourth electromagnetic shielding layer 214D.

In this instance, the first short side SS1 of the first electromagnetic shielding layer 214A and the second short side SS2 of the second electromagnetic shielding layer 214B may be positioned adjacent to each other. The first short side SS1 of the third electromagnetic shielding layer 214C and the second short side SS2 of the fourth electromagnetic shielding layer 214D may be positioned adjacent to each other. The second long side LS2 of the first electromagnetic shielding layer 214A and the first long side LS1 of the third electromagnetic shielding layer 214C may be positioned adjacent to each other. The second long side LS2 of the second electromagnetic shielding layer 214B and the first long side LS1 of the fourth electromagnetic shielding layer 214D may be positioned adjacent to each other.

Each of the protrusions 1300, 1310, 1320, and 1330 may be positioned to be spaced apart from one another in the first direction DR1 or the second direction DR2.

For example, the protrusions 1300 positioned on the first short side SS1 of the first electromagnetic shielding layer 214A and the protrusions 1310 positioned on the second short side SS2 of the second electromagnetic shielding layer 214B may be spaced apart from each other in the second direction DR2. The protrusions 1320 positioned on the first short side SS1 of the third electromagnetic shielding layer 214C and the protrusions 1330 positioned on the second short side SS2 of the fourth electromagnetic shielding layer 214D may be spaced apart from each other in the second direction DR2.

Further, the protrusions 1300 positioned on the second long side LS2 of the first electromagnetic shielding layer 214A and the protrusions 1320 positioned on the first long side LS1 of the third electromagnetic shielding layer 2140 may be spaced apart from each other in the first direction DR1. The protrusions 1310 positioned on the second long side LS2 of the second electromagnetic shielding layer 214B and the protrusions 1330 positioned on the first long side LS1 of the fourth electromagnetic shielding layer 214D may be spaced apart from each other in the first direction DR1.

In the structure illustrated in FIG. 24, the size of the seam area SA between the two adjacent plasma display panels may be reduced.

Figure 25:
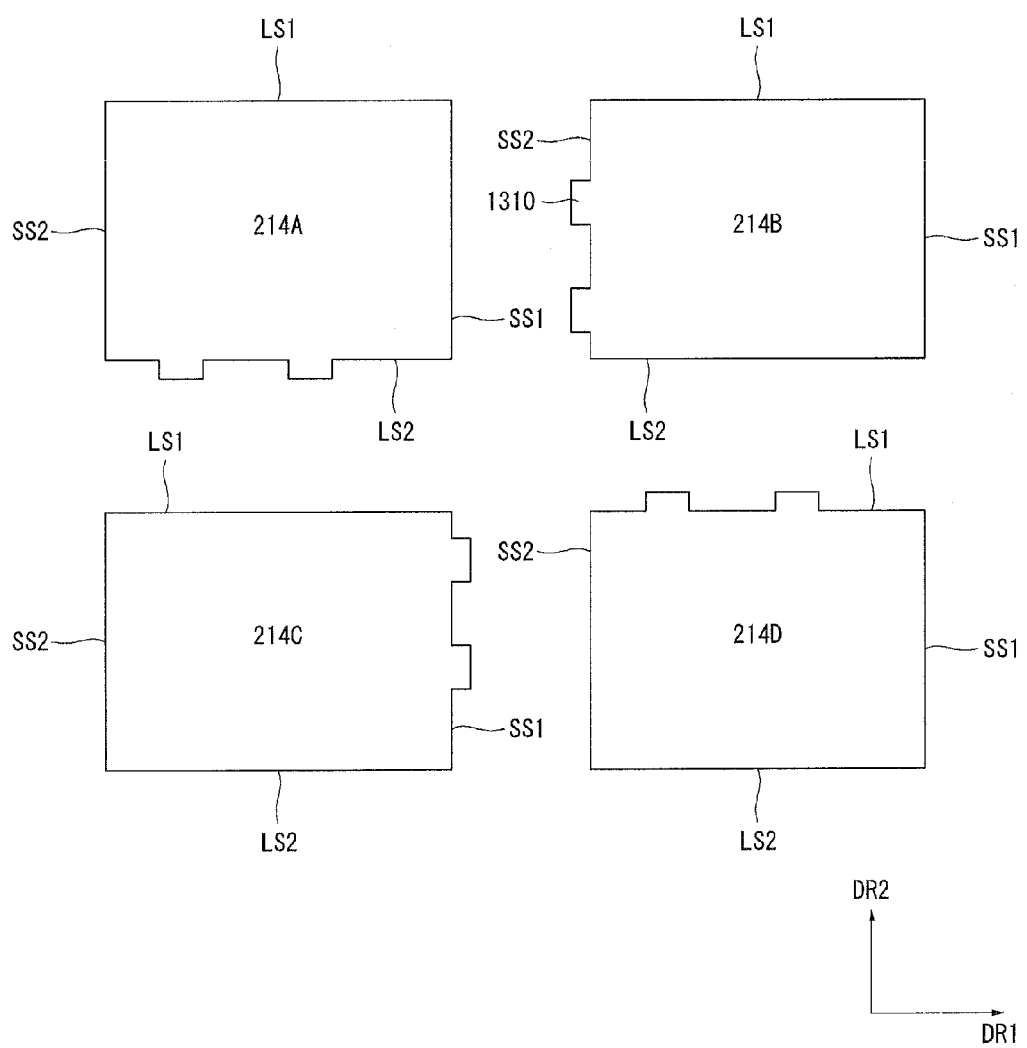

Alternatively, as shown in FIG. 25, the protrusions 1300 may be formed on the second long side LS2 of the first electromagnetic shielding layer 214A. The protrusions 1310 may be formed on the second short side SS2 of the second electromagnetic shielding layer 214B. The protrusions 1320 may be formed on the first short side SS1 of the third electromagnetic shielding layer 214C. The protrusions 1330 may be formed on the first long side LS1 of the fourth electromagnetic shielding layer 214D.

In this instance, the first short side SS1 of the first electromagnetic shielding layer 214A and the second short side SS2 of the second electromagnetic shielding layer 214B may be positioned adjacent to each other. The first short side SS1 of the third electromagnetic shielding layer 214C and the second short side SS2 of the fourth electromagnetic shielding layer 214D may be positioned adjacent to each other. The second long side LS2 of the first electromagnetic shielding layer 214A and the first long side LS1 of the third electromagnetic shielding layer 214C may be positioned adjacent to each other. The second long side LS2 of the second electromagnetic shielding layer 214B and the first long side LS1 of the fourth electromagnetic shielding layer 214D may be positioned adjacent to each other.

Further, the protrusions 1300 of the first electromagnetic shielding layer 214A may be adjacent to the first long side LS1 of the third electromagnetic shielding layer 214C on which the protrusion is not formed. The protrusions 1320 of the third electromagnetic shielding layer 214C may be adjacent to the second short side SS2 of the fourth electromagnetic shielding layer 214D on which the protrusion is not formed. The protrusions 1330 of the fourth electromagnetic shielding layer 214D may be adjacent to the second long side LS2 of the second electromagnetic shielding layer 214B on which the protrusion is not formed. The protrusions 1310 of the second electromagnetic shielding layer 214B may be adjacent to the first short side SS1 of the first electromagnetic shielding layer 214A on which the protrusion is not formed.

In the structure illustrated in FIG. 25, the size of the seam area SA between the two adjacent plasma display panels may be reduced.

Alternatively, the first electromagnetic shielding layer 214A and a first frame 200A may be connected to each other on one side of the first panel 100 among the adjacent first and second panels 100 and 110, and the second electromagnetic shielding layer 214B and a second frame 200B may be connected to each other on one side of the second panel 110. The other side opposite the one side of the first panel 100 may be adjacent to the one side of the second panel 110.

More specifically, as shown in FIG. 26(a), the protrusions 1300 may be formed on the second short side SS2 of the first electromagnetic shielding layer 214A, and the protrusions 1310 may be formed on the second short side SS2 of the second electromagnetic shielding layer 214B.

The first short side SS1 of the first electromagnetic shielding layer 214A opposite the second short side SS2 of the first electromagnetic shielding layer 214A, on which the protrusion is not formed, may be adjacent to the second short side SS2 of the second electromagnetic shielding layer 214B.

Hence, as shown in FIG. 26(b), the protrusions 1300 of the first electromagnetic shielding layer 214A and the first frame 200A may be connected to each other on one side of the first panel 100 (i.e., the second short side SS2 of the first electromagnetic shielding layer 214A). The protrusions 1310 of the second electromagnetic shielding layer 214B and the second frame 200B may be connected to each other on one side of the second panel 110 (i.e., the second short side SS2 of the second electromagnetic shielding layer 214B).

Figure 27:
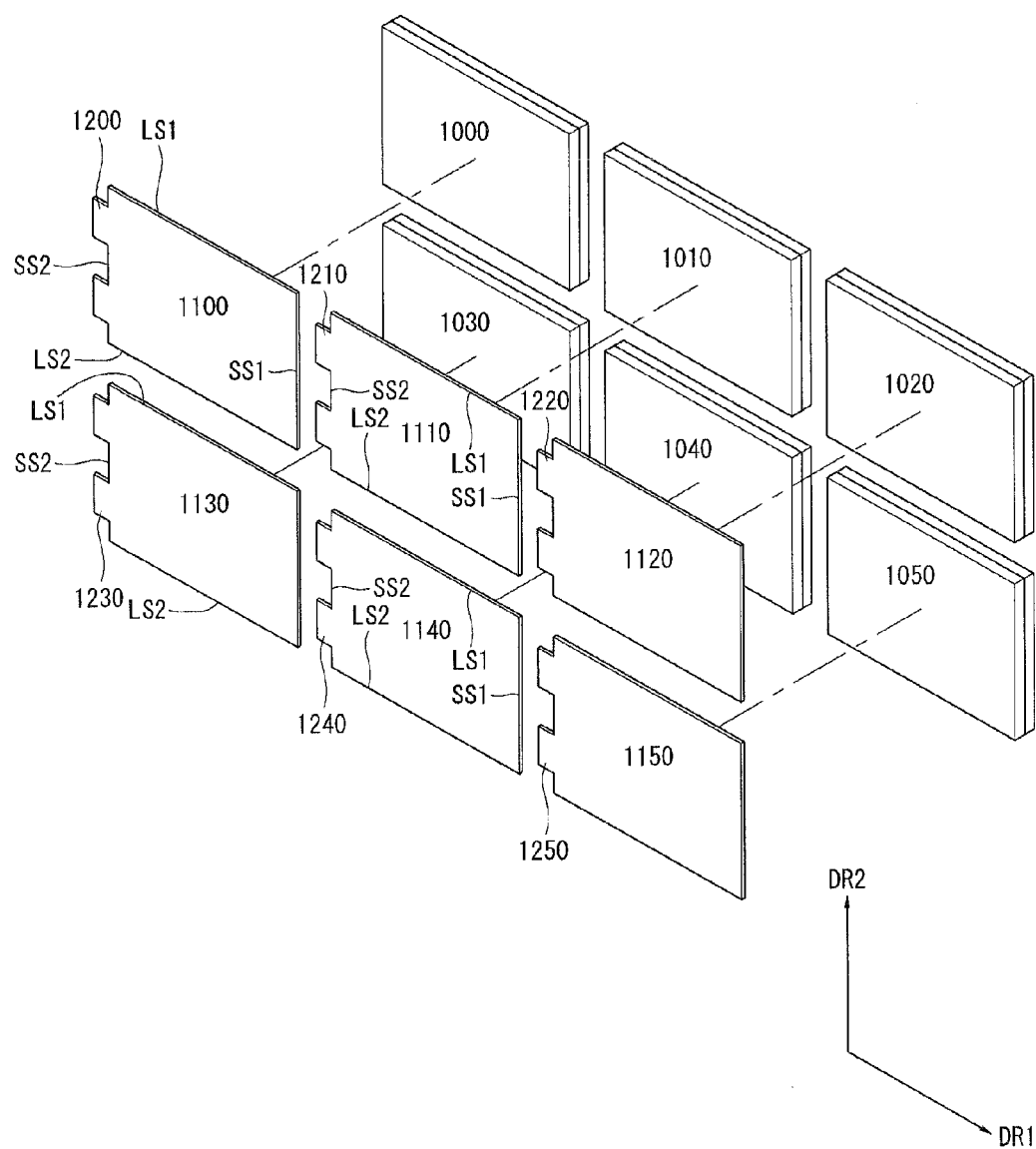

In the structure illustrated in FIG. 26, because the electromagnetic shielding layers may be arranged in the same pattern, the plasma display panels may be arranged differently from the matrix structure of 2×2. For example, as shown in FIG. 27, the plurality of plasma display panels may be arranged in a matrix structure of 3×2. Further, various matrix structures of 2×3, 3×3, 3×4, 4×3, 4×4, 5×5, and 6×6 may be used.

In the structure illustrated in FIG. 27, a first panel 1000 may be positioned adjacent to a second panel 1010 in a first direction DR1 and may be positioned adjacent to a third panel 1030 in a second direction DR2 crossing the first direction DR1. A fourth panel 1040 may be positioned adjacent to the third panel 1030 in the first direction DR1 and may be positioned adjacent to the second panel 1010 in the second direction DR2.

A first electromagnetic shielding layer 1100 may be positioned on a front surface of the first panel 1000, a second electromagnetic shielding layer 1110 may be positioned on a front surface of the second panel 1010, a third electromagnetic shielding layer 1130 may be positioned on a front surface of the third panel 1030, and a fourth electromagnetic shielding layer 1140 may be positioned on a front surface of the fourth panel 1040.

Further, a first frame (not shown) may be positioned on a back surface of the first panel 1000, a second frame (not shown) may be positioned on a back surface of the second panel 1010, a third frame (not shown) may be positioned on a back surface of the third panel 1030, and a fourth frame (not shown) may be positioned on a back surface of the fourth panel 1040.

In this instance, the first electromagnetic shielding layer 1100 may be connected to the first frame in a first region of the first panel 1000, the second electromagnetic shielding layer 1110 may be connected to the second frame in a first region of the second panel 1010, the third electromagnetic shielding layer 1130 may be connected to the third frame in a first region of the third panel 1030, and the fourth electromagnetic shielding layer 1140 may be connected to the fourth frame in a first region of the fourth panel 1040.

A second region of the first panel 1000 opposite the first region of the first panel 1000 may be adjacent to the first region of the second panel 1010 in the first direction DR1. A second region of the third panel 1030 opposite the first region of the third panel 1030 may be adjacent to the first region of the fourth panel 1040 in the first direction DR1.

The first region of each of the first to fourth panels 1000, 1010, 1030, and 1040 may correspond to a second short side SS2 of each panel, and the second region of each of the first to fourth panels 1000, 1010, 1030, and 1040 may correspond to a first short side SS1 of each panel. The second short sides SS2 of the first to fourth panels 1000, 1010, 1030, and 1040 may correspond to second short sides SS2 of the first to fourth electromagnetic shielding layers 1100, 1110, 1130, and 1140, respectively. Further, the first short sides SS1 of the first to fourth panels 1000, 1010, 1030, and 1040 may correspond to first short sides SS1 of the first to fourth electromagnetic shielding layers 1100, 1110, 1130, and 1140, respectively.

The first electromagnetic shielding layer 1100 and the first frame may not be connected to each other and the third electromagnetic shielding layer 1130 and the third frame may not be connected to each other in an area between the first panel 1000 and the third panel 1030. The second electromagnetic shielding layer 1110 and the second frame may not be connected to each other and the fourth electromagnetic shielding layer 1140 and the fourth frame may not be connected to each other in an area between the second panel 1010 and the fourth panel 1040.

In other words, protrusions of the first electromagnetic shielding layer 1100 and protrusions of the third electromagnetic shielding layer 1130 may not be positioned between the first panel 1000 and the third panel 1030. Protrusions of the second electromagnetic shielding layer 1110 and protrusions of the fourth electromagnetic shielding layer 1140 may not be positioned between the second panel 1010 and the fourth panel 1040.

FIGS. 28 to 35 illustrate a structure of a multi display device according to another exemplary embodiment of the invention. Structures and components identical or equivalent to those described in FIGS. 1 to 27 are designated with the same reference numerals, and a further description may be briefly made or may be entirely omitted.

Figure 28:
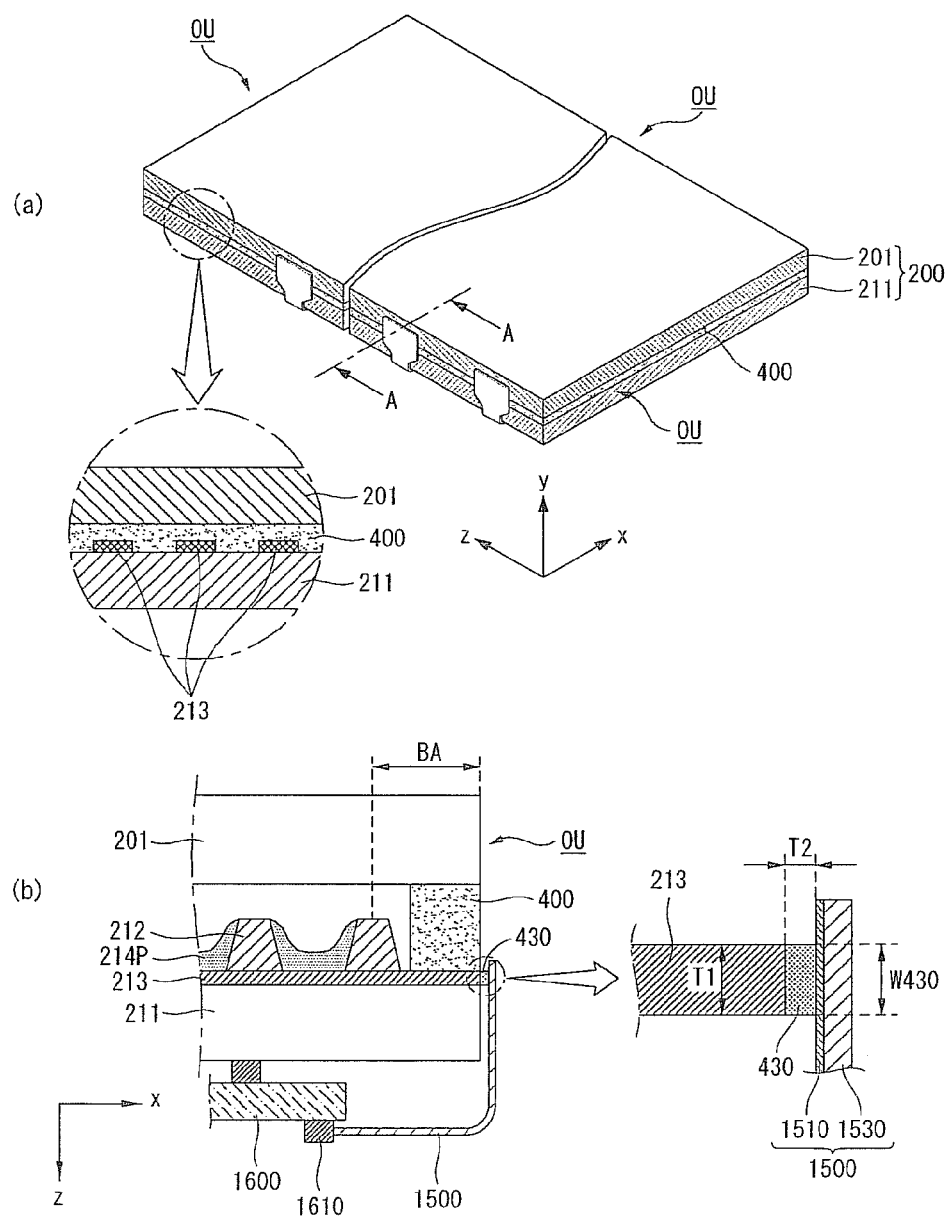
FIGS. 28 to 35 illustrate another structure of a multi display device according to an exemplary embodiment of the invention.

As shown in FIG. 28, a plasma display device may include a plasma display panel (PDP) 200, a driving board 1600, and a flexible circuit board 1500 for electrically connecting the PDP 200 to the driving board 1600.

Electrodes 213 may be exposed to a side section OU of the PDP 200. The electrode 213 may be one of the first and second electrodes. In the following description, the electrode 213 may be the address electrode, for example.

The driving board 1600 may be positioned on a back surface of a back substrate 211. The driving board 1600 may supply a driving signal to the address electrodes 213, thereby selecting discharges cells to be turned on. The driving board 1600 may have a connector 1610 connected to the flexible circuit board 1500.

The flexible circuit board 1500 may electrically connect the address electrodes 213 to the connector 1610 of the driving board 1600. The flexible circuit board 1500 may have the flexibility and may have a predetermined circuit pattern. The flexible circuit board 1500 may include a tape carrier package (TCP) and a flexible printed circuit board (FPCB).

The flexible circuit board 1500 may include a base substrate 1530 and a plurality of connection electrodes 1510 formed on the base substrate 1530. The plurality of connection electrodes 1510 may be connected to the address electrodes 213 exposed to the side section of the PDP 200, respectively.

More specifically, one end of the connection electrode 1510 may be connected to the address electrode 213, and the other end may be connected to the connector 1610 of the driving board 1600. Hence, the connection electrode 1510 may receive the data signal Dt (refer to FIG. 5) from the address electrode 213.

A conductive adhesive layer 430 may be positioned between the flexible circuit board 1500 and the side section of the address electrodes 213, thereby electrically connecting the connection electrodes 1510 to the address electrodes 213. Hence, the flexible circuit board 1500 may surround a portion of the side section of the PDP 200.

As above, when the flexible circuit board 1500 may be electrically connected to the side section of the address electrodes 213, the size of a bezel area BA of the PDP 200, on which the image is not displayed, may be reduced.

As shown in FIG. 28(*b*) that is a cross-sectional view taken along line A-A of FIG. 28(*a*), the conductive adhesive layer 430 may improve the structural stability in a connection part between the flexible circuit board 1500 and the address electrodes 213 and may reduce a contact resistance of the connection part. The conductive adhesive layer 430 may be formed of anisotropic conductive film (ACF) for the efficiently electrical connection The anisotropic conductive film may be a material of a double sided tape in which an adhesive cured by heat is mixed with a fine conductive ball in the adhesive. When a pressure is applied to the anisotropic conductive film at a high temperature, the conductive ball contacting the address electrode 213 may be broken, thereby enabling current to flow therein. Further, the remaining portion of the anisotropic conductive film may be filled with the adhesive and may be cured, thereby attaching the address electrode 213 to the flexible circuit board 1500.

A thickness T2 of the conductive adhesive layer 430 may be greater than or substantially equal to a thickness T1 of the address electrode 213, so as to improve the structural stability in the connection part between the flexible circuit board 1500 and the address electrodes 213.

FIG. 28(*b*) illustrates that a width W430 of the conductive adhesive layer 430 may be substantially equal to the thickness T1 of the address electrode 213 in a Z-axis direction. Unlike the structure illustrated in FIG. 28(*b*), the width W430 of the conductive adhesive layer 430 may be greater than the thickness T1 of the address electrode 213 in the Z-axis direction, so as to further improve the structural stability in the connection part.

FIG. 28(*b*) illustrates the conductive adhesive layer 430 between the side of the address electrode 213 and the connection electrode 1510. Unlike the structure illustrated in FIG. 28(*b*), the conductive adhesive layer 430 may be omitted, if desired.

Figure 29:
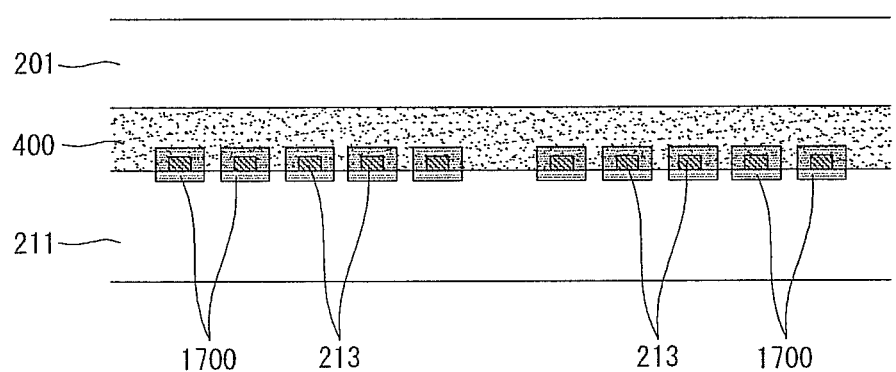

FIG. 29 illustrates a side section of the PDP when viewed in an X-axis direction of FIG. 28.

The structure illustrated in FIG. 29 is different from the structure illustrated in FIG. 28, in that each of the address electrodes 213 has a connection member 1700.

More specifically, the connection member 1700 formed of a metal material may be positioned at the side of the address electrode 213 exposed to the side section OU of the PDP 200. The connection member 1700 may be formed by laminating a sheet to the side of the address electrode 213.

Figure 30:
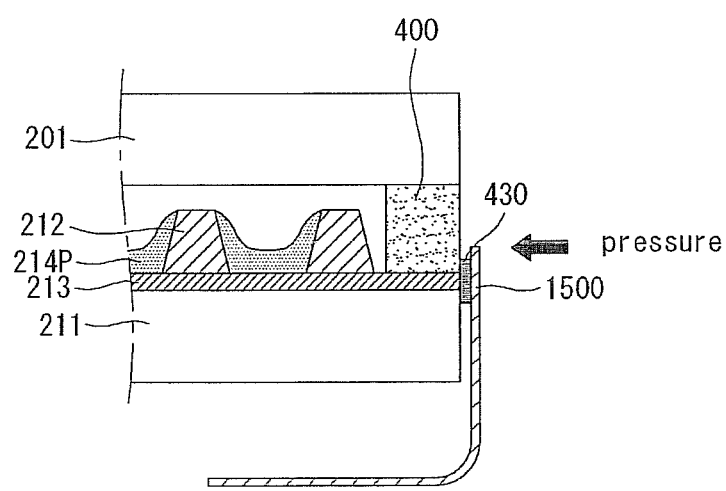

As shown in FIG. 30, the flexible circuit board 1500 may be positioned on the connection member 1700 and may be welded, or may be positioned on an anisotropic conductive film 430 positioned on the side of the address electrode 213. In such a position state, a pressure may be applied the flexible circuit board 1500 at a predetermined temperature, thereby connecting applied the flexible circuit board 1500 to the driving board.

Figure 31:
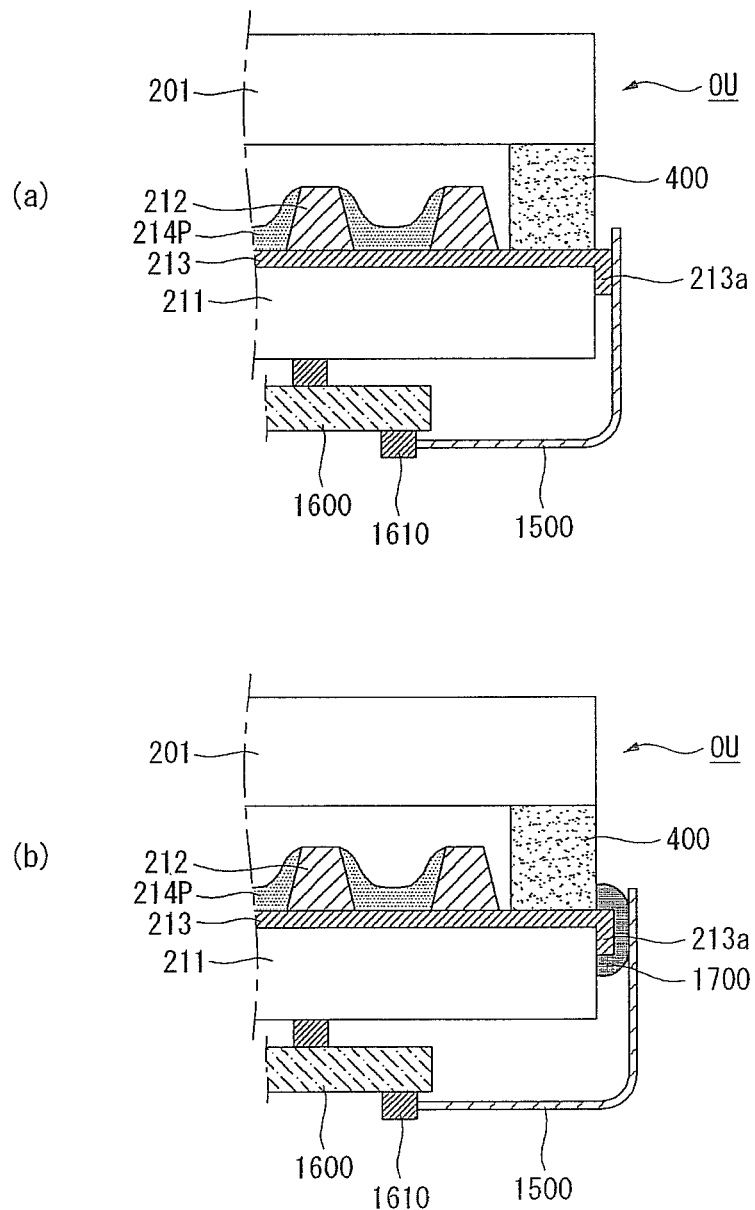

FIG. 31 illustrates the flexible circuit board 1500 connected to the side section of the PDP.

As shown in FIG. 31, the plurality of connection electrodes 1510 of the flexible circuit board 1500 may be respectively connected to the plurality of address electrodes 213. The flexible circuit board 1500 may be positioned parallel to the side of the plurality of address electrodes 213.

More specifically, a portion of the address electrode 213 may protrude to the side of the PDP and may be bent in a direction of the back substrate 211 of the PDP. In such a position state, the flexible circuit board 1500 may be positioned on the protruding portion of the address electrode 213, thereby electrically connecting the address electrodes 213 to the flexible circuit board 1500. As above, because the address electrode 213 may include a bending part 213*a*, a contact area between the flexible circuit board 1500 and the address electrode 213 may increase. Hence, the structural stability of the electrical connection between the flexible circuit board 1500 and the address electrodes 213 may be improved, and the contact resistance therebetween may decrease.

Further, the above-described connection member 1700 may be formed on the bending part 213*a* of the address electrode 213 so as to further reduce the contact resistance.

Figure 32:
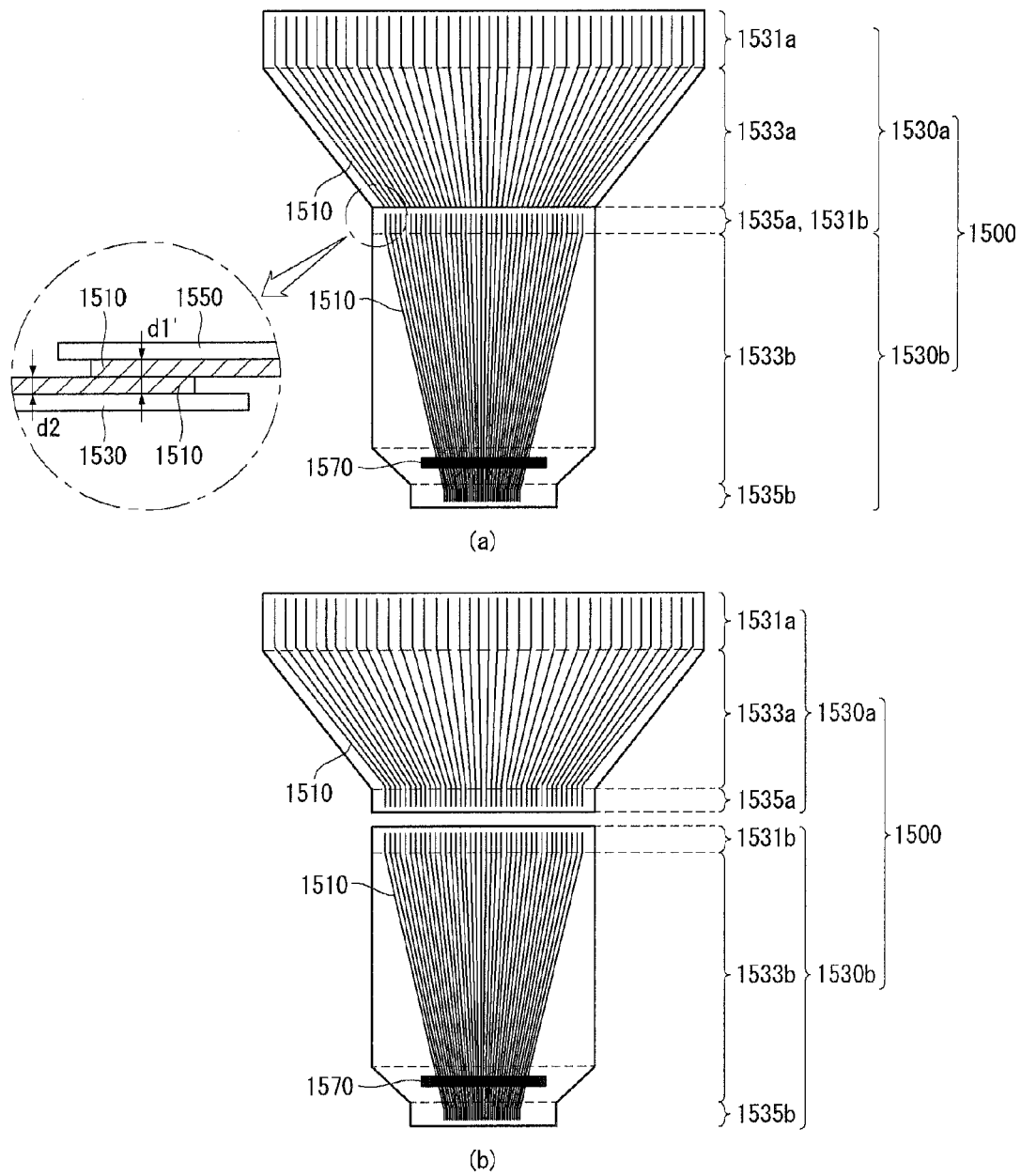

FIG. 32 illustrates an exemplary configuration of the flexible circuit board 1500 for connecting a driver to the side of an electrode. As shown in FIG. 32, the flexible circuit board 1500 may be formed using the plurality of base substrates 1530. FIG. 32(*a*) illustrates a combined structure of a first base substrate 1530*a* and a second base substrate 1530*b*, and FIG. 32(*b*) illustrates a detached structure of the first base substrate 1530*a* and the second base substrate 1530*b*.

As shown in FIG. 32, the flexible circuit board 1500 may include the first base substrate 1530*a* and the second base substrate 1530*b*. The plurality of connection electrodes 1510 with the conductivity may be formed on each of the first base substrate 1530*a* and the second base substrate 1530*b*.

More specifically, as shown in FIG. 32(*b*), the first base substrate 1530*a* may include a first panel connection part 1531*a*, a first decreasing part 1533*a*, and a first substrate connection part 1535*a*. The second base substrate 1530*b* may include a second substrate connection part 1531*b*, a second decreasing part 1533*b*, and a second connection part 1535*b*.

As shown in FIG. 32(*a*), in the flexible circuit board 1500, the plurality of connection electrodes 1510 of the first substrate connection part 1535*a* and the plurality of connection electrodes 1510 of the second substrate connection part 1531*b* may overlap each other and may be electrically connected to each other. The first substrate connection part 1535*a* of the first base substrate 1530*a* may be separated from the second substrate connection part 1531*b* of the second base substrate 1530*b*.

A thickness d1' of an overlap portion between the connection electrode 1510 of the first substrate connection part 1535*a* and the connection electrode 1510 of the second substrate connection part 1531*b* may be less than a thickness d2 of a non-overlap portion between the connection electrode 1510 of the first substrate connection part 1535*a* and the connection electrode 1510 of the second substrate connection part 1531*b*. FIG. 32 illustrates that the connection electrodes 1510 of the first substrate connection part 1535*a* are directly connected to the connection electrodes 1510 of the second substrate connection part 1531*b* without another adhesive layer between the connection electrodes 1510 of the first substrate connection part 1535*a* and the connection electrodes 1510 of the second substrate connection part 1531*b*. Alternatively, the connection electrodes 1510 of the first substrate connection part 1535*a* may be electrically connected to the connection electrodes 1510 of the second substrate connection part 1531*b* using the anisotropic conductive film.

Figure 33:
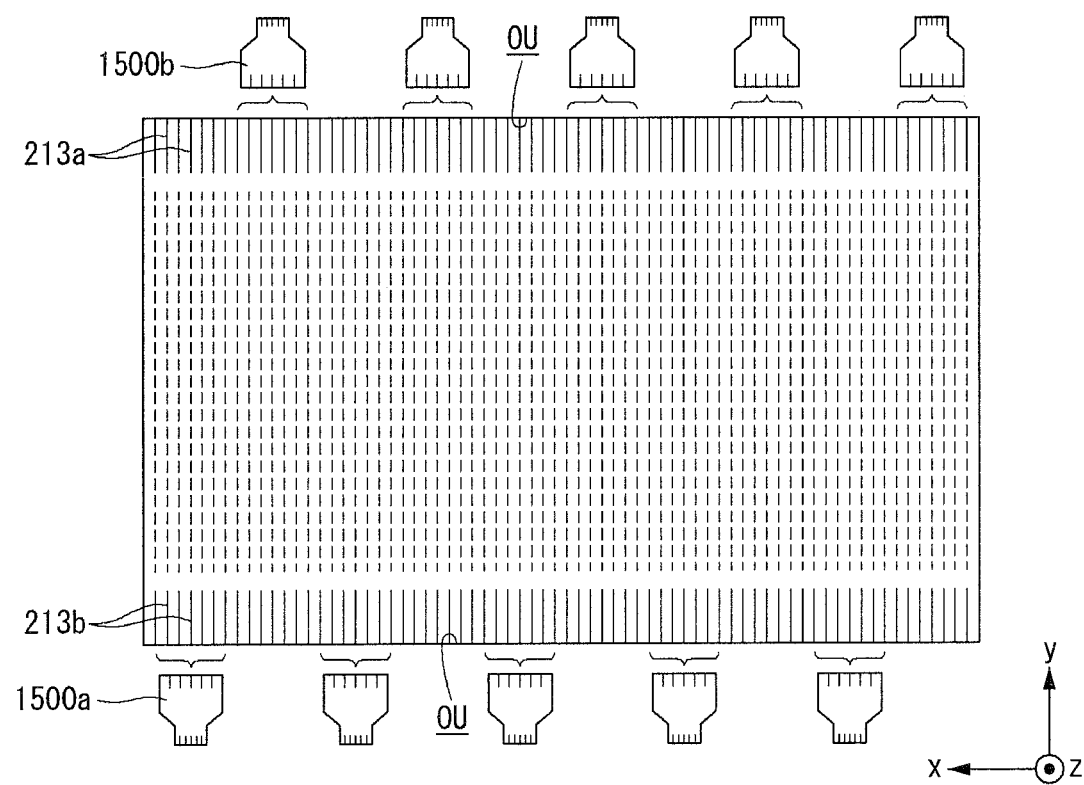

As shown in FIG. 33, the address electrodes 213 may extend in a y-axis direction and may be positioned parallel to one another. Thus, the address electrodes 213 may entirely form a stripe shape.

As described above, both ends 213*a* and 213*b* of the address electrode 213 may be exposed to the side section of the PDP. More specifically, the upper end 213*a* of the address electrode 213 may be exposed to the outside through the upper side section OU of the PDP, and the lower end 213*b* of the address electrode 213 may be exposed to the outside through the lower side section OU of the PDP.

The flexible circuit board 1500 may be positioned vertically to the side section OU of the PDP in a z-axis direction and may be connected to the address electrodes 213. In general, the plurality of address electrodes 213 may be divided into a plurality of groups, and each group may be connected to the flexible circuit board 1500. For example, the plurality of address electrodes 213 may be divided into 10 groups, and the 15 flexible circuit boards 1500 may be used to connect the address electrodes 213 to the driving board.

In the embodiment of the invention, the address electrodes 213 belonging to odd-numbered groups, i.e., 1st, 3rd, 5th, 7th, and 9th groups may be connected to the flexible circuit boards 1500 through the lower ends 213*b* of the address electrodes 213 positioned in the lower area of the PDP. Hence, the flexible circuit boards 1500*a* connected to the address electrodes 213 belonging to the odd-numbered groups may be positioned under the PDP. On the other hand, the address electrodes 213 belonging to even-numbered groups, i.e., 2nd, 4th, 6th, 8th, and 10th groups may be connected to the flexible circuit boards 1500 through the upper ends 213*a* of the address electrodes 213 positioned in the upper area of the PDP. Hence, the flexible circuit boards 1500*b* connected to the address electrodes 213 belonging to the even-numbered groups may be positioned above the PDP.

As above, in the embodiment of the invention, the address electrodes 213 may be exposed to the outside through the upper side section and the lower side section of the PDP, and the flexible circuit boards 1500 positioned above and under the PDP may be selectively connected to the address electrodes 213.

Further, because the flexible circuit boards 1500 may be selectively formed above and under the PDP, a distance between the adjacent flexible circuit boards 1500 may increase. Hence, it may be easy to dispose an alignment mark or a thermal press equipment used to attach the flexible circuit boards 1500.

Further, when the flexible circuit boards 1500 are connected to the address electrodes 213 at the side section of the PDP, the disconnection between the flexible circuit boards 1500 and the address electrodes 213 may be generated. However, when the problem is generated in the upper flexible circuit board 1500 positioned above the PDP, the lower flexible circuit board 1500 positioned under the PDP may be used instead of the upper flexible circuit board 1500. Thus, a repair is easy.

Further, because the flexible circuit boards 1500 may be selectively formed above and under the PDP, the data voltage applied through the driving board 1600 may be supplied to the discharge cells in different directions through the flexible circuit boards 1500 positioned above and under the PDP.

As time passed, the data voltage may drop because of the line resistance, etc. Hence, the address discharge may be insufficiently generated in the discharge cell to which the data voltage is later applied. As a result, the image quality may be reduced. However, in the embodiment of the invention, a difference between application time points of the data voltage may decrease by applying the data voltage to the discharge cells in the different directions. Hence, the reduction in the image quality may be prevented.

Furthermore, in a multi plasma display panel having a plurality of plasma display panels, the seam area between the plasma display panels may be minimized.

Figure 34:
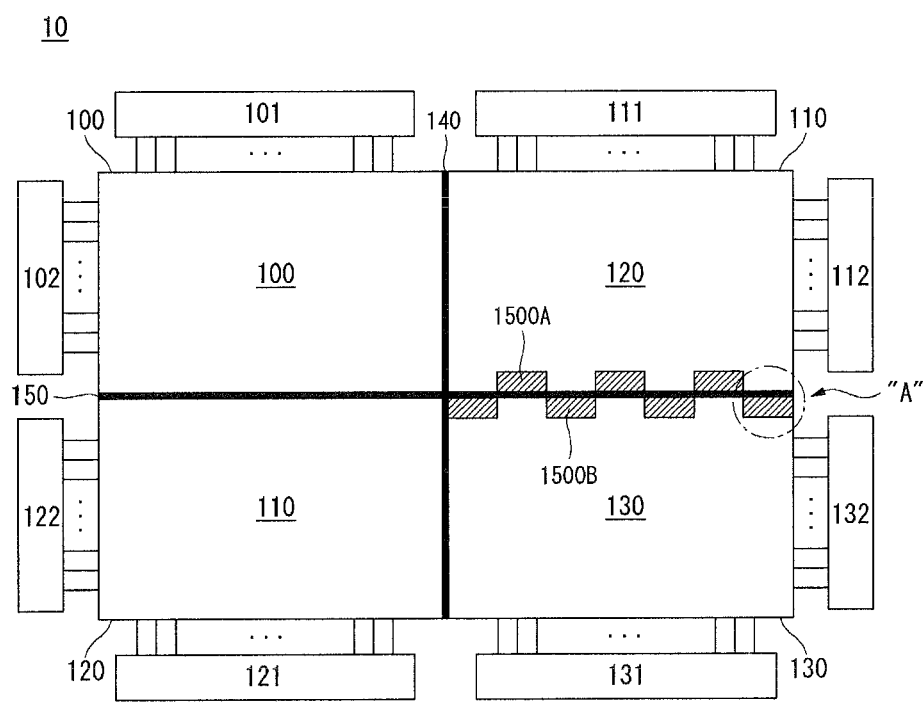
Figure 35:
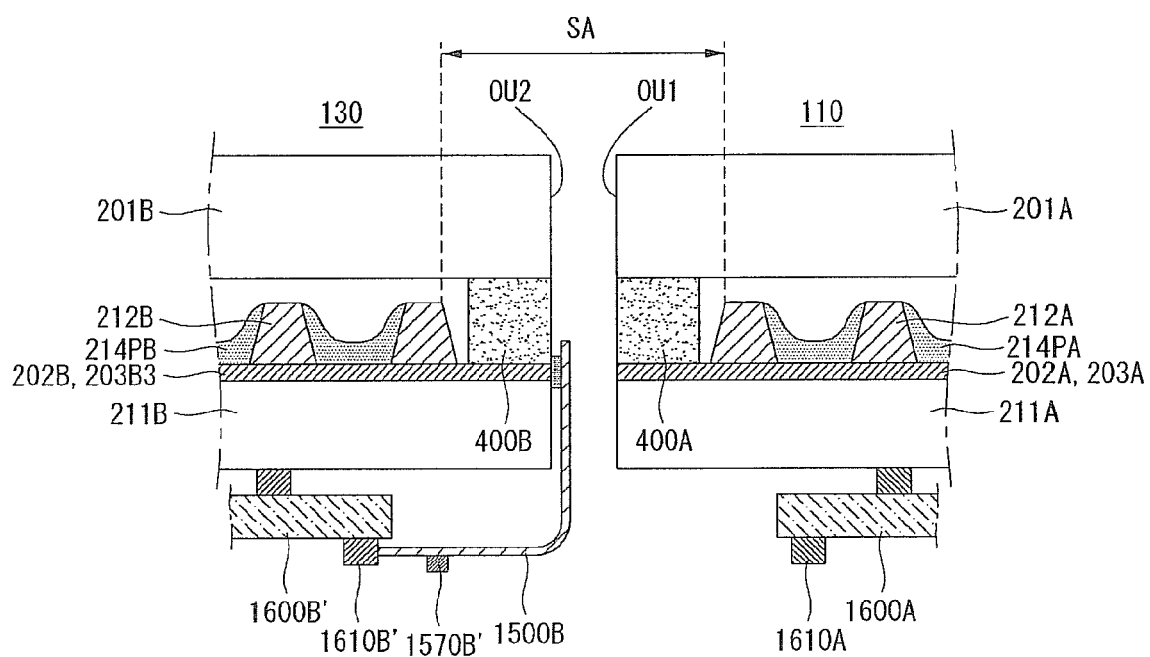

FIG. 34 illustrates a multi plasma display panel 10 having a matrix structure of 2×2, and FIG. 35 illustrates an enlarged cross-sectional view of a portion "A" of FIG. 34.

As shown in FIG. 34, the multi plasma display panel 10 may include a plurality of PDPs 100, 110, 120, and 130 that are positioned adjacent to one another.

As shown in FIG. 35, the flexible circuit board 1500D of the fourth panel 130 may be positioned and the flexible circuit board 1500B of the second panel 110 may not be positioned in the seam area SA between the second panel 110 and the fourth panel 130.

More specifically, as described above with reference to FIG. 33, the flexible circuit boards 1500 may be positioned at the upper, lower, left, and right sides of the PDP and may be connected to the address electrodes 213. Namely, the flexible circuit board 1500B may be positioned at the side section OU1 of the second panel 110, and the flexible circuit board 1500D may be positioned at the side section OU2 of the fourth panel 130.

Hence, when the flexible circuit board 1500B is positioned at the side section OU1 of the second panel 110, the flexible circuit board 1500D may not be positioned at the side section OU2 of the fourth panel 130. When the flexible circuit board 1500B is not positioned at the side section OU1 of the second panel 110, the flexible circuit board 1500D may be positioned at the side section OU2 of the fourth panel 130.

As above, because the flexible circuit board 1500B of the second panel 110 and the flexible circuit board 1500D of the fourth panel 130 are staggered in the seam area SA, the interference between the flexible circuit boards 1500B and 1500D may be prevented. Hence, the size of the seam area SA may be reduced. As a result, the image may be naturally displayed on the two panels. Further, the image quality of the multi plasma display panel 10 may be improved.

Although the exemplary embodiment of the invention describes the multi plasma display panel 10 having the matrix structure of 2×2, other matrix structures may be used. For example, the multi plasma display panel 10 having a matrix structure of 3×3 may have the same effect as the multi plasma display panel 10 having the matrix structure of 2×2.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A multi display device comprising:
    a first display panel;
    a first frame positioned on a back surface of the first display panel;
    a first electromagnetic shielding layer including a first portion positioned on a front surface of the first display panel and a second portion positioned on a side of the first display panel;
    a second display panel positioned adjacent to the first display panel;
    a second frame positioned on a back surface of the second display panel; and
    a second electromagnetic shielding layer including a first portion positioned on a front surface of the second display panel and a second portion positioned on a side surface of the second display panel, wherein the second portion of the first electromagnetic shielding layer is positioned adjacent to the second portion of the second electromagnetic shielding layer, wherein the second portion of the first electromagnetic shielding layer and the second portion of the second electromagnetic shielding layer are positioned between the first and second display panels, and wherein the second portion of the first electromagnetic shielding layer and the second portion of the second electromagnetic shielding layer are staggered.

2. The multi display device of claim 1, wherein the first portion of the first electromagnetic shielding layer and the first portion of the second electromagnetic shielding layer each have a rectangular shape, wherein the second portion of the first electromagnetic shielding layer is positioned on one side of the first portion of the first electromagnetic shielding layer, and wherein the second portion of the second electromagnetic shielding layer is positioned on one side of the first portion of the second electromagnetic shielding layer.

3. The multi display device of claim 1, wherein the second portion of the first electromagnetic shielding layer and the second portion of the second electromagnetic shielding layer are positioned between the first and second display panels to be spaced apart from each other.

4. The multi display device of claim 1, wherein the second portion of the first electromagnetic shielding layer is connected to the first frame, and the second portion of the second electromagnetic shielding layer is connected to the second frame.

5. The multi display device of claim 1, wherein a first conductive part is formed between the second portion of the first electromagnetic shielding layer and the first frame, and wherein a second conductive part is formed between the second portion of the second electromagnetic shielding layer and the second frame.

6. The multi display device of claim 5, wherein each of the first and second conductive parts includes a conductive tape.

7. The multi display device of claim 5, wherein the first conductive part and the second conductive part are staggered.

8. The multi display device of claim 5, wherein the first conductive part and the second conductive part are positioned between the first and second display panels to be spaced apart from each other.

9. A multi display device comprising:
    a first display panel;
    a first frame positioned on a back surface of the first display panel;
    a first electromagnetic shielding layer that is positioned on a front surface of the first display panel and extends to the first frame;
    a second display panel positioned adjacent to the first display panel in a first direction;
    a second frame positioned on a back surface of the second display panel; and
    a second electromagnetic shielding layer that is positioned on a front surface of the second display panel and extends to the second frame, wherein a portion of the first electromagnetic shielding layer extending to the first frame and a portion of the second electromagnetic shielding layer extending to the second frame are positioned between the first and second display panels, and wherein the portion of the first electromagnetic shielding layer extending to the first frame and the portion of the second electromagnetic shielding layer extending to the second frame are staggered.

10. The multi display device of claim 9, wherein the portion of the first electromagnetic shielding layer extending to the first frame and the portion of the second electromagnetic shielding layer extending to the second frame are spaced apart from each other in a second direction crossing the first direction.

11. A multi display device comprising:
    a first display panel;
    a first frame positioned on a back surface of the first display panel;
    a first electromagnetic shielding layer positioned on a front surface of the first display panel;
    a first conductive part positioned on a side of the first display panel, the first conductive part having one end connected to the first electromagnetic shielding layer and the other end connected to the first frame;
    a second display panel positioned adjacent to the first display panel in a first direction;

a second frame positioned on a back surface of the second display panel;

a second electromagnetic shielding layer positioned on a front surface of the second display panel; and a second conductive part positioned on-the a side of the second display panel, the second conductive part having one end connected to the second electromagnetic shielding layer and the other end connected to the second frame, wherein the first conductive part and the second conductive part are positioned between the first display panel and the second display panel, and wherein the first conductive part and the second conductive part are staggered.

12. The multi display device of claim 11, wherein the first conductive part and the second conductive part are spaced apart from each other in a second direction crossing the first direction.

13. The multi display device of claim 11, wherein the first conductive part and the first electromagnetic shielding layer are connected to each other on the front surface of the first display panel, and wherein the second conductive part and the second electromagnetic shielding layer are connected to each other on the front surface of the second display panel.

14. The multi display device of claim 11, wherein each of the first and second conductive parts includes a conductive tape.

* * * * *